(12) United States Patent
Novak

(10) Patent No.: US 6,765,650 B2
(45) Date of Patent: Jul. 20, 2004

(54) VACUUM COMPATIBLE AIR BEARING STAGE

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 160 days.

(21) Appl. No.: 09/927,683

(22) Filed: Aug. 9, 2001

(65) Prior Publication Data

US 2003/0030778 A1 Feb. 13, 2003

(51) Int. Cl.⁷ .................. G03B 27/58; G03B 27/62; G03B 27/52
(52) U.S. Cl. .............. 355/72; 355/75; 355/30
(58) Field of Search .............. 355/53, 72, 73, 355/77, 75, 76, 30; 250/492.2

(56) References Cited

U.S. PATENT DOCUMENTS 5,820,104 A * 10/1998 Koyano et al. ............. 251/326
6,421,112 B1 * 7/2002 Bisschops et al. ........... 355/53
6,445,440 B1 * 9/2002 Bisschops et al. ........... 355/53

FOREIGN PATENT DOCUMENTS

| EP | 1052546 A2 | 11/2000 |
|---|---|---|
| EP | 1052547 A2 | 11/2000 |
| EP | 1052548 A2 | 11/2000 |
| EP | 1052549 A2 | 11/2000 |
| EP | 1052550 | 11/2000 |
| EP | 1052551 A2 | 11/2000 |
| EP | 1052552 A2 | 11/2000 |
| EP | 1052553 A2 | 11/2000 |

* cited by examiner

Primary Examiner—Russell Adams
Assistant Examiner—D. Ben Esplin
(74) Attorney, Agent, or Firm—Ritter, Lang & Kaplan LLP

(57) ABSTRACT

An air bearing stage device which is suitable for use with a vacuum environment is disclosed. According to one aspect of the present invention, a stage apparatus includes a table that is positioned in a system vacuum chamber, a first rod that carries the table, and first and second plates that support the first rod. The first plate includes an air bearing surface that is held against the first side of a first wall by a first vacuum force. A first drive mechanism drives the first plate to move the first rod in a first direction, and also drives the second plate to move the first rod in the first direction, while a second drive mechanism which includes a second rod and a first linear motor causes the second rod to move the first rod in a second direction.

50 Claims, 15 Drawing Sheets

VACUUM COMPATIBLE AIR BEARING STAGE

BACKGROUND OF THE INVENTION

1. Field of Invention

The present invention relates generally to semiconductor processing equipment. More particularly, the present invention relates to a scanning stage apparatus which may be efficiently implemented for use in an electron beam projection system.

2. Description of the Related Art

Lithography processes, e.g., photo-lithography processes, are integral to the fabrication of wafers and, hence, semiconductor chips. Conventional systems used for lithography include optical lithography systems and electron beam projection systems. Many optical lithography systems and electron beam projection systems may use a direct writing process to "write" on wafers. However, direct writing processes are often relatively slow, as will be appreciated by those skilled in the art.

In order to increase the speed at which wafers may be written to, electron beam projection systems, as well as optical lithography systems, may project beams of finite area through patterns. The patterns are generally resident on a reticle, which effectively serves as a mask or a negative for a wafer. For an electron beam projection system, a relatively broad beam of electrons may be collimated and provided to a reticle, which may be a silicon wafer, e.g., a wafer that is suitable for scattering with angular limitation projection electron beam lithography or a stencil-type wafer. Typically, rather than absorbing the beam, the pattern deflects portions of the beam in order to prevent electrons from being ultimately focused onto a wafer.

FIG. 1a is a diagrammatic representation of one standard configuration of a lens system of an electron beam projection system. In general, a lens system 104 includes an illumination lens 108 and a projection lens 124. An electron beam is arranged to pass through illumination lens 108, to a reticle 112 that is held by a reticle stage 116 in a vacuum chamber 120. As an electron beam passes through reticle 112, portions of the electron beam are allowed to pass through reticle 112, while other portions of the electron beam may be scattered to prevent those portions from being focused onto a wafer 128 that is held, e.g., by a stage (not shown), in a wafer chamber 130, i.e., a vacuum chamber. In other words, reticle 112 acts as a mask to effectively mask out part of an electron beam. Projection lens 124 is arranged to project the pattern of electrons, i.e., the pattern of electrons which are not masked out by reticle 112, onto wafer 128.

Stages, such as reticle stage 116 or a wafer stage, are often used to facilitate a lithography process. The use of reticle stage 116, for example, enables reticle 112 to be readily scanned over a surface of wafer 128 to enable a pattern of electrons to be projected onto different portions of wafer 128. The design of a stage such as reticle stage 116 for use in an electron beam projection system may be complicated, as an electron beam projection system generally must not include moving magnets or metals which alter the magnetic field associated with the electron beam projection system and, hence, the electron beam.

Although separate vacuum chambers may be used to house a reticle and a wafer, an entire lens system may generally be housed in a single vacuum chamber. FIG. 1b is a diagrammatic representation of a standard lens system of an electron beam projection system which is contained within a vacuum chamber. Like lens system 104 of FIG. 1a, a lens system 154 includes an illumination lens 158 and a projection lens 174. An electron beam is arranged to pass through illumination lens 158. The electron beam then passes from illumination lens 158 to a reticle 162 that masks out part of the electron beam. Reticle 162 is generally positioned on a reticle stage 170 that allows reticle 162 to be scanned. After passing through reticle 162, portions of the electron beam which are not masked out by the reticle then pass through projection lens 174 and onto wafer 178. As shown, illumination lens 158, reticle 162, reticle stage 170, projection lens 174, and wafer 178 are all contained within a vacuum chamber 180.

Electron beam projection systems are often used in lieu of optical systems because a lens system associated with an electron beam projection system may dynamically move a projection image to follow a stage, which is generally not possible with an optical system, as will be appreciated by those skilled in the art. In addition, electron beam lens systems typically correct for relatively small errors in relative stage positions, whereas optical systems generally do not. However, electron beam projection systems often have specific requirements which are not requirements for typical optical lithography systems. By way of example, an electron beam projection system generally must operate in a high vacuum environment. Maintaining a high vacuum environment may be expensive, as any gas leakage into the vacuum environment must be corrected as the gas leakage typically compromises the vacuum level.

It is often desirable to have moving parts associated with an electron beam projection system. For example, a wafer may be placed on a wafer stage which enables the wafer to be positioned beneath a projection column as appropriate. Similarly, a reticle placed on a reticle stage enables the position of the reticle with respect to a wafer to be readily adjusted. However, moving parts within a vacuum may cause problems with electron beams as linear motors and magnetic elements may interfere with magnetic fields. An electron beam projection system may not include moving magnets, as moving magnets cause the magnetic field associated with the electron beam projection system to change. Further, an electron beam projection system also may not having moving iron structures, due to the fact that moving iron dynamically alters the static magnetic fields around an electron beam lens, as will be appreciated by those skilled in the art.

Many scanning stage devices which are suitable for use in a high vacuum environment are relatively large, e.g., have a relatively large moving mass. The size of the scanning stage devices is due, at least in part to, arranging the stage device such that linear motors or magnetic elements do not significantly affect an electron beam. As will be appreciated by those skilled in the art, the larger a mass is, the larger the power requirements are for moving the mass. Many conventional stage devices also leak a significant amount of gas into a vacuum chamber, as air bearings are often used to support and guide portions of stages within a vacuum, and many standard air bearings leak. Maintaining the vacuum level in a vacuum chamber to accommodate gas leakage is often difficult or impractical.

Therefore, what is needed is a method and an apparatus for enabling reticles to be scanned efficiently within an electron beam projection system. That is, what is desired is a vacuum compatible stage which is relatively compact, efficient, and suitable for use in a relatively high vacuum environment.

SUMMARY OF THE INVENTION

The present invention relates to an air bearing stage device for use in a vacuum environment which maintains linear motors and magnetic elements outside of a vacuum chamber. According to one aspect of the present invention, a scanning stage apparatus includes a table that is positioned in a system vacuum chamber and a first rod that carries the table. The apparatus also includes first and second plates that support the first rod. The first plate includes an air bearing surface that is arranged to be held against the first side of a first wall by a first vacuum force. A first drive mechanism drives the first plate to move the first rod in a first direction, and also drives the second plate to move the first rod in the first direction, while a second drive mechanism which includes a second rod and a first linear motor causes the second rod to move the first rod in a second direction. In one embodiment, the first wall is an exterior wall of the system vacuum chamber within which a vacuum level is maintained.

In another embodiment, the scanning stage apparatus also includes a first sleeve and a second sleeve. The first sleeve supports the first rod through the first sleeve such that when the first drive mechanism drives the first plate to move the first rod in the first direction, the first drive mechanism drives the first plate such that the first plate moves the first sleeve and the first rod. The second sleeve also supports the first rod through the second sleeve such that when the first drive mechanism drives the second plate to move the first rod in the first direction, the first drive mechanism drives the second plate such that the second plate moves the second sleeve and the first rod. In such an embodiment, the first sleeve may be in contact with the first plate through a first flexure bearing and the second sleeve may be in contact with the second plate through a second flexure bearing.

A scanning stage apparatus of the present invention reduces the amount of gas leakage into a system vacuum chamber, and also maintains actuators and magnetic elements outside of the system vacuum chamber. Hence, contamination and magnetic interference within the system vacuum chamber may be reduced. In addition, the mass of a moving portion of a stage may be reduced through the use of hollow rods to carry a table, as well as the positioning of motors off of the hollow rods. Maintaining actuators, e.g., linear motors, in an air environment as opposed to a vacuum environment also allows for easier access to the actuators, e.g., for maintenance purposes. Therefore, the scanning stage apparatus may operate more efficiently and more precisely.

According to another aspect of the present invention, a stage device that is arranged to scan a reticle in a vacuum environment includes a rod and a table that accommodates the reticle and is coupled to the first end of the rod. First and second plates support the rod. At least the first plate includes an air bearing surface that is at least partially held against an exterior wall of a system vacuum chamber by a first vacuum force. A first drive arrangement drives the first plate and the second plate in a first direction and, hence, drives the rod in the first direction. A second drive arrangement that is coupled to the first rod drives the first rod in a second direction. Finally, a third drive arrangement that is substantially coupled to the second drive arrangement drives the first rod, the first plate, and the second plate in a third direction. The third drive arrangement, the second drive arrangement, the first drive arrangement, the first plate, and the second plate are substantially external to the system chamber.

In one embodiment, the second drive arrangement is coupled to the second end of the first rod and the system chamber contains a vacuum. In such an embodiment, a force counteractor counteracts atmospheric pressure forces on the first rod that have the tendency to pull or push the first rod into the system chamber. The force counteractor may include a spring arrangement which applies a force to the first coil to counteract the atmospheric pressure forces on the first rod.

In another embodiment, the second drive arrangement is coupled to the first rod between the first end and a second end of the rod, and the system chamber contains a first vacuum. In such an embodiment, a dummy chamber which contains a second vacuum accommodates the second end of the first rod therein. The dummy chamber often includes an exterior surface, and the second plate often includes an air bearing surface that is arranged to at be held against the exterior surface of the dummy chamber by a second vacuum force.

According to still another aspect of the present invention, a scanning stage apparatus includes a system chamber which has a vacuum level and an external surface, as well as a table positioned within the system chamber and a rod which carries the table. A first plate is arranged to support the rod substantially outside of the system chamber, and includes a first surface that is substantially held against the external surface of the system chamber by a first vacuum force. A second plate is also arranged to support the rod substantially outside of the system chamber. A first actuator arrangement drives the first plate and the second plate along a first axis such that the rod is also driven along the first axis. A second actuator arrangement drives the first plate and the second plate along a second axis, and effectively drives the rod along the second axis.

In one embodiment, the first plate supports the rod through a first sleeve and the second plate supports the rod through a second sleeve. In such an embodiment, the first plate and the first sleeve are flexually attached to enable the rod to rotate about the first axis and about the second axis. The flexural attachment may be accomplished through the use of a flexure bearing.

In another embodiment, the scanning stage apparatus includes a dummy chamber that is arranged to maintain a vacuum level therein. The rod is coupled to the table at a first end of the rod and a second end of the rod is positioned within the dummy chamber, whereby positioning the second end of the rod within the dummy chamber counteracts at least some of the atmospheric pressure forces associated with the rod. In such an embodiment, the dummy chamber may include an external surface, and the second plate may include a first surface that is substantially held against the external surface of the dummy chamber by a second vacuum force.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Conventional scanning stage devices which are suitable for use in a high vacuum environment, as for example a high vacuum environment associated with an electron beam projection system, have a relatively large moving mass. In addition, many conventional stage devices also leak a significant amount of gas into a vacuum chamber, as air bearings are often used to move portions of stages within a vacuum, and many standard air bearings leak.

A stage device of the present invention maintains linear motors and magnetic elements such that the linear motors and magnetic elements are not internal to a system vacuum chamber, i.e., the vacuum chamber in which reticles are to be positioned. By positioning linear motors and magnetic elements substantially external to a system vacuum chamber, the magnetic fields around electron beams may remain substantially unchanged. Further, maintaining linear motors substantially outside of the system vacuum chamber, e.g., in an air environment, enables the motors to be readily accessed for maintenance, and reduces the amount of contamination within the vacuum chamber.

In addition to maintaining linear motors and magnetic elements, e.g., magnet tracks, outside of a system vacuum chamber, air bearings which allow reticles to translate may also be maintained at least partially outside of the vacuum chamber, and reduce gas leakage into the system vacuum chamber. Reducing gas leakage into the system vacuum chamber facilitates the maintenance of a desired vacuum level within the system vacuum chamber, as the vacuum level within the system vacuum is less likely to be compromised.

In one embodiment of the present invention, a rod which is arranged to carry a reticle table may also be arranged to be hollow such that system hoses, wires, and cables may be positioned within the rod and, as a result, remain substantially isolated from a system vacuum chamber. That is, hoses, wires, and cables may be positioned within a hollow rod such that they are not exposed to system vacuum chamber. The use of a hollow rod also reduces the mass associated with a moving stage, i.e., a stage which includes the rod and the reticle table. As a result, the power or force needed to cause the stage to move may be reduced.

Figure 1A:
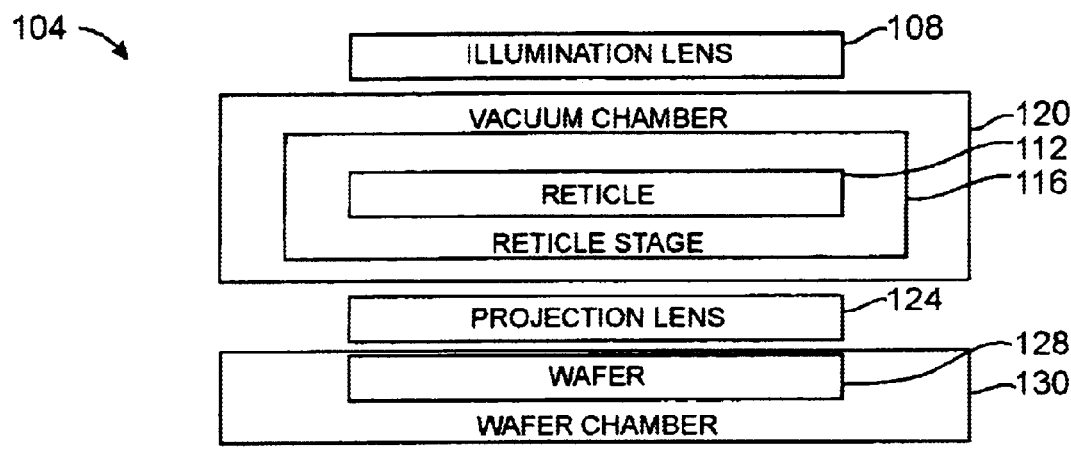
FIG. 1a is a diagrammatic representation of one standard configuration of a lens system of an electron beam projection system.
Figure 1B:
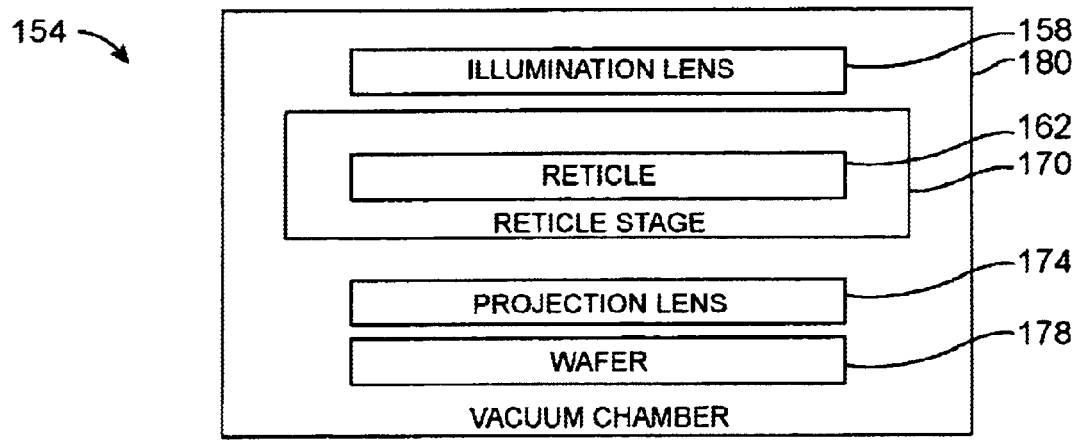
FIG. 1b is a diagrammatic representation of one standard configuration of a lens system of an electron beam projection system.
Figure 2:
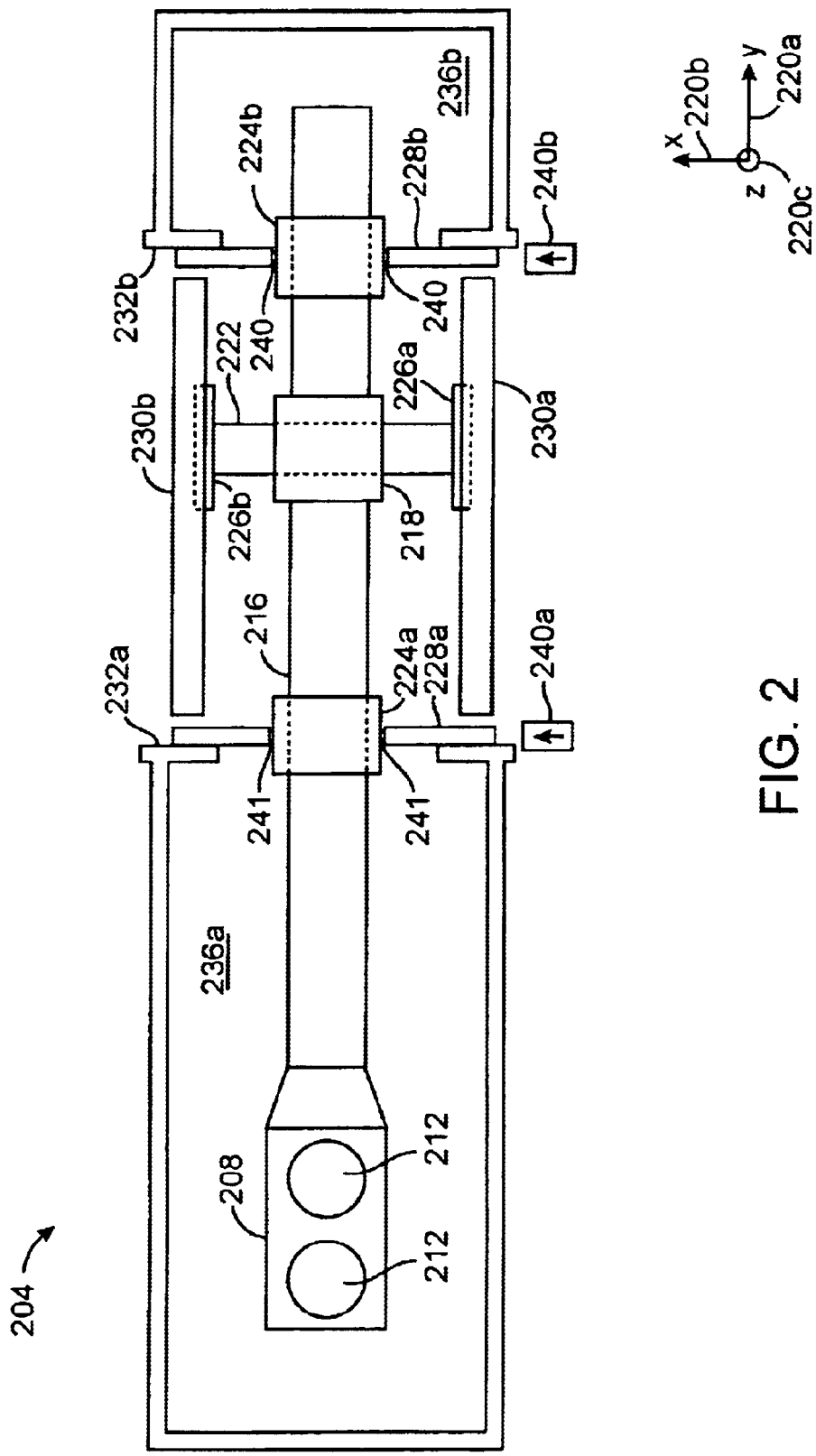
FIG. 2 is a diagrammatic top-view schematic representation of a vacuum compatible reticle stage device with air bearings in accordance with a first embodiment of the present invention.

FIG. 2 is a diagrammatic top-view schematic representation of a vacuum compatible reticle stage device with air bearings in accordance with a first embodiment of the present invention. A stage device 204 includes a reticle table 208 which is arranged to carry reticles 212 thereon. Reticle table 208 is carried on a rod 216 which is arranged to translate along a y-axis 220a. That is, a central axis of rod 216 is aligned along y-axis 220a such that rod 216 may cause reticle table 208 to move along y-axis 220a. Rod 216, and reticle table 208, will be described below with respect to FIG. 3.

Rod 216 generally supports a sleeve 218 through which a rod 222 or a shaft may be placed. In one embodiment, rod 216 is formed from two component rods, and sleeve 218 is positioned substantially at the point that the two component rods are connected in a line. Rod 222 is arranged to translate in a y-direction along y-axis 220a. Rod 222 may slide within sleeve 218 and, alternatively, rod 216 and sleeve 218 may effectively slide over rod 222.

Each end of rod 222 is substantially attached to a linear motor which includes a coil 226 and a magnet track 230. Coils 226 and magnet tracks 230 cooperate to control the linear position of both rod 222 and rod 216 along y-axis 220a. Coil 226a and magnet track 230a may be differentially controlled with respect to coil 226b and magnet track 230b such that the rotational position of both rod 222 and rod 216 may be controlled about a z-axis 220c. As reticle table 208 is carried by rod 216, the differential control of linear motors at the ends of rod 222 serves to control the translational position of reticle table 208 along y-axis 220a, in addition to the rotational position of reticle table 208 with respect to z-axis 220c. The stroke of rod 216 and, hence, reticle table 208, along y-axis 220a may generally be widely varied depending upon the size of components of stage device 204 and the requirements of stage device 204. By way of example, the stroke of rod 216 along y-axis 220a may be up to approximately 600 millimeters (mm).

Figure 4:
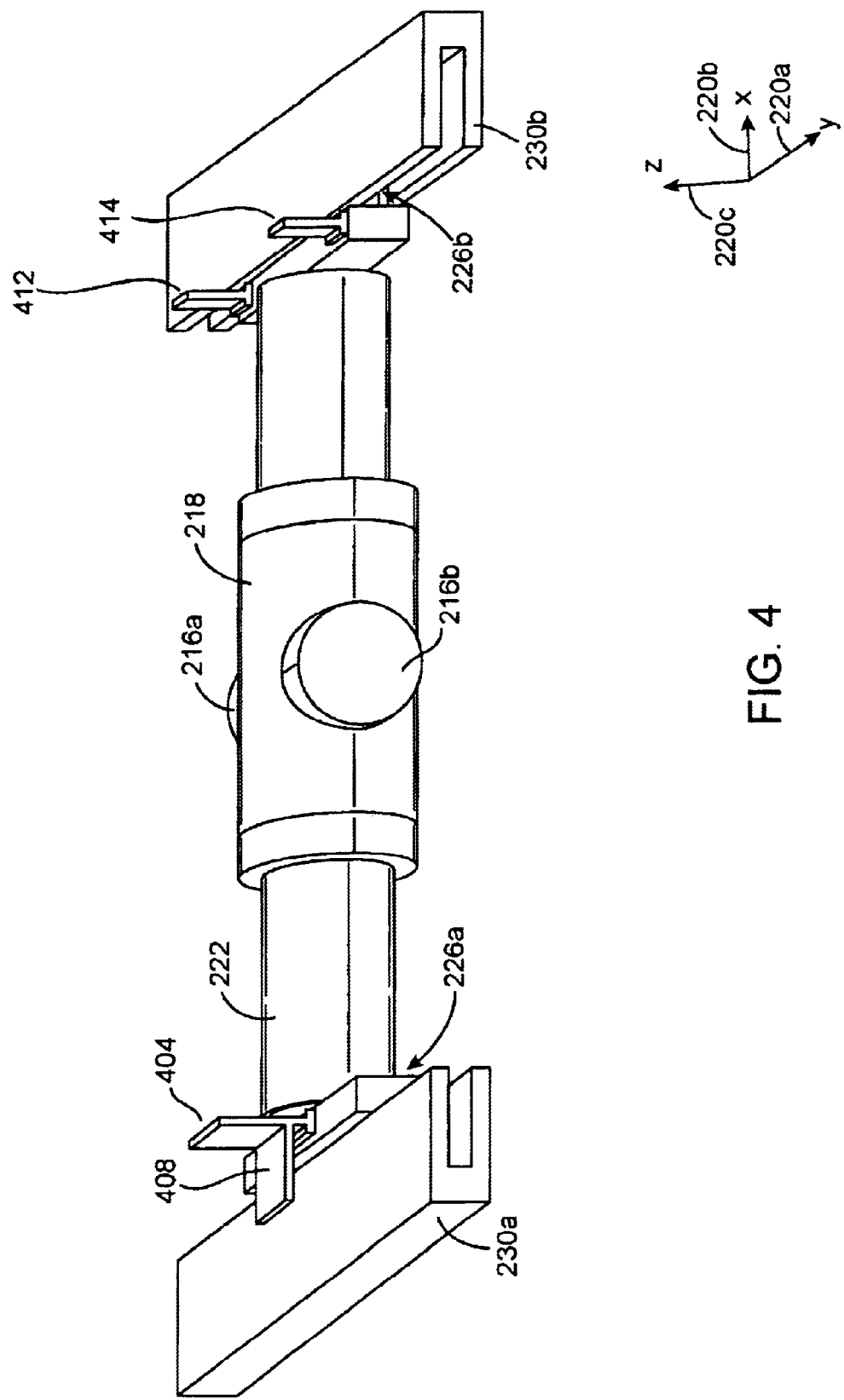
FIG. 4 is a diagrammatic representation of a rod and a sleeve, e.g., rod 222 and sleeve 218 as shown in FIG. 2, in accordance with a first embodiment of the present invention.

As will be discussed below with reference to FIG. 4, each end of rod 222 may also be coupled to additional linear motors. One end of rod 222 may be coupled to a linear motor which enables both rod 222 and rod 216 and, as a result, reticle plate 208, to undergo translational motion along y-axis 220a, as well as rotational motion about z-axis 220c. The other end of rod 222 may be coupled to a linear motor which also enables translational motion of rod 222 and rod 216 along y-axis 220b and rotational motion with respect to z-axis 220c, while additionally enabling rotational motion about an x-axis 220b.

Rod 216 is supported by sleeves 224 which, in turn, are each supported by a plate 228, i.e., rod 216 is in contact with sleeves 224 which are in contact with plates 228. Sleeves 224 are arranged such that rod 216 may slide therethrough. Plates 228, which may be formed from a relatively lightweight material such as alumina ceramic, are vertically oriented along x-axis 220b. Plates 228 may be supported against walls 232 of chambers 236 by air bearings under plates 228. Plate 228a is typically held or sealed against wall 232a by a vacuum force, while plate 228b is typically held or sealed against wall 232b by a vacuum force. The vacuum forces may be provided through the air bearings under plates 228. The air bearings under plates 228 may move along walls 232 or, more specifically, along guides associated with walls 232 while substantially held against walls 232. One air bearing configuration which is suitable for use with plates 228 will be described below with respect to FIG. 11.

Linear motors 240 may be used to drive plates 228 along x-axis 220b and, as a result, cause rod 216 to be displaced along x-axis 220b, i.e., moved in an x-direction. It should be appreciated that when linear motors 240 move plates 228 along x-axis 220b, sleeve 218, which is coupled to rod 216, effectively slides over rod 222 which typically does not translate a significant amount with respect to x-axis 220b. The stroke of rod 216 along x-axis 220b may vary widely depending upon the overall requirements of stage device 204. In one embodiment, rod 216 has a stroke along x-axis 220b of up to approximately 170 mm. Differential motion of plates 228 may cause a relatively small rotation of rod 216 about x-axis 220b. Specifically, differential motion of plates 228 may cause rod 216 and, hence, reticle table 208, to rotate with respect to x-axis 220b. It should be appreciated that such differential motion of plates 228 allows reticles 212 to effectively be moved and positioned in six degrees of freedom. That is, reticles 212 may be translated and rotated with respect to y-axis 220a, x-axis 220b, and z-axis 220c.

In order to provide some leeway for rod 216 to move, flexures such as flexure bearings 241 may be positioned between sleeves 224 and plates 228. Flexure bearings 241 enable sleeves 224 and rod 216 to twist. That is, flexure bearings 241, e.g., bellows or diaphragms, allow sleeves 224 and rod 216 to rotate slightly about x-axis 220b and z-axis 220c. The ability for sleeves 224 to twist may prevent over-constraining of rod 216 in the event that at least one of rod 216 and sleeves 224 is misaligned.

Reticle table 208 is held within vacuum chamber 236a which may be considered to be a system vacuum chamber. Positioning reticle table 208 within vacuum chamber 236a allows reticle table 208 to be used as a part of a lithography system which uses a vacuum chamber, as for example an electron beam projection system. It should be appreciated that reticle table 208 may also be positioned within vacuum chamber 236a for use with other types of lithography systems.

The use of stage device 204 substantially keeps actuators, or linear motors such as linear motors 240, as well as linear motors which include coils 226 and magnet tracks 230, and magnetic elements out of vacuum chamber 236a. Hence, there maybe less interference experienced by an electron beam being projected through reticles 212. In addition, by maintaining linear motors outside of vacuum chamber 236a, linear motors may be readily accessed for maintenance purposes.

Maintaining air bearings, e.g., air bearings which are part of plate 228a, out of vacuum chamber 236a reduces the amount of gas which may be leaked into vacuum chamber 236a. Hence, the level of vacuum within vacuum chamber 236a may be more readily maintained, and less likely to become contaminated. Although the level of vacuum within vacuum chamber 236a may vary depending upon the requirements of a particular application, the vacuum is generally on the order of approximately $10^{-6}$ Torr.

Dummy chamber 236b, as mentioned above, has wall 232b which supports plate 228b. The air bearing associated with plate 228b may move along wall 232b, e.g., a guide or a protrusion associated with wall 232b. In addition to providing a surface which supports plate 228b, dummy chamber 236b maintains an internal vacuum which effectively neutralizes the forces on rod 216 which are caused by atmospheric pressure. Atmospheric pressure on rod 216 would tend to push rod 216 into vacuum chamber 236a. Hence, maintaining a vacuum within dummy chamber 236b, and having an end of rod 216 protrude into dummy chamber 236, enables dummy chamber to effectively counteract the forces on rod 216 which are caused by atmospheric pressure. That is, the vacuum within dummy chamber 236b serves to prevent rod 216 from being pulled into vacuum chamber 236a as a result of forces caused by atmospheric pressure.

The amount of vacuum maintained in dummy chamber 236b may vary. Generally, the amount of vacuum in dummy chamber 236b may be significantly less than the amount of vacuum maintained in vacuum chamber 236a. For instance, when the vacuum in vacuum chamber 236a is on the order of approximately $10\ e^{-6}$ Torr, the vacuum in dummy chamber 236b may be on the order of approximately 1 Torr. As the vacuum within dummy chamber 236b is less than the vacuum within vacuum chamber 236a, the pumps associated with dummy chamber 236b may be less powerful than those associated with vacuum chamber 236a. Also, the air bearing associated with plate 228b may be less precise than the air bearing associated with plate 228a, as reducing the amount of leakage and contamination is less important with respect to dummy chamber 236b that it is with respect to vacuum chamber 236a.

Dummy chamber 236b, as well as magnet tracks 230, may be mounted with respect to an apparatus such as a reaction frame which is arranged to support stage device 204 such that reticle table 208 may be held within vacuum chamber 236a. The reaction frame effectively supports stage device 204 such that plate 228a may be held against wall 232a of vacuum chamber 236. One embodiment of a reaction frame will be discussed below with respect to FIG. 5.

Figure 3:
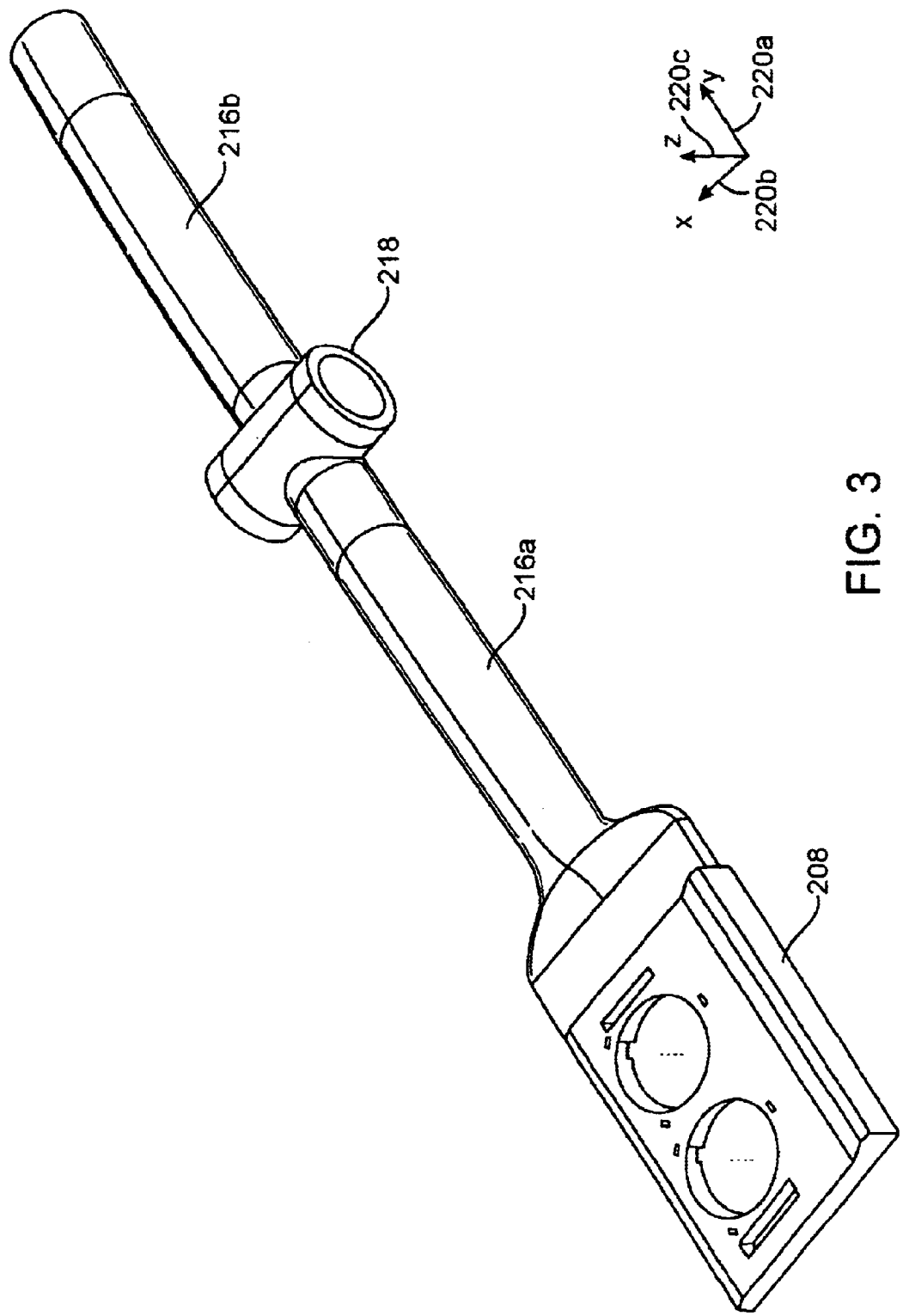
FIG. 3 is a diagrammatic representation of a rod and a reticle table, e.g., one rod 216 and reticle table 208 of FIG. 2, in accordance with a first embodiment of the present invention.

Referring next to FIG. 3, one embodiment of rod 216 and reticle table 208 will be described in accordance with the present invention. Rod 216 may be made up of component rods 216a, 216b which are joined by sleeve 218. Forming rod 216 from component rods 216a, 216b, and effectively using sleeve 218 to connect component rods 216a, 216b may reduce the overall size of a scanning device, i.e., scanning device 204 of FIG. 2, by allowing a rod which slides within sleeve 218 to be placed in substantially the same plane as rod 216. As shown, component rods 216a, 216b are connected in line with their central axes with respect to y-axis 220a.

Although component rods 216a, 216b may be solid, component rods 216a, 216b are often formed as hollow rods. Hollow rods are relatively lightweight, and generally require less force to move than solid rods of the same diameter and length. In addition, the use of hollow component rods 216a, 216b allows substantially any cables or wires which carry signals, as well as any air supply hoses, between reticle table 208 and external controllers or devices, e.g., computers, to be routed through component rods 216a, 216b at their connections to sleeve 218. Routing cables and wires through component rods 216a, 216b, which may contain ambient air or nitrogen, prevents cables and wires from being substantially directly exposed to vacuum and, hence, from having to be maintained within a vacuum. Further, many issues associated with moving cables along with reticle table 208 to be alleviated, as the cables may travel along with component rods 216a, 216b.

Component rods 216a, 216b typically have round, e.g., circular, cross-sections, as rounded component rods 216a, 216b may translate and rotate within sleeves, e.g., sleeves 224 of FIG. 2, relatively easily. However, component rods 216a, 216b do not necessarily have round cross-sections.

For example, component rods 216a, 216b may have substantially rectangular cross-sections. Component rods 216a, 216b may also be configured such that component rod 216a has a different cross-sectional shape from component rod 216b.

The materials used to form component rods 216a, 216b may vary depending upon a variety of different factors. The factors may include, but are not limited to, the desired weight of component rods 216a, 216b and the desired specific stiffness of component rods 216a, 216b. Typically, a material with a relatively high specific stiffness which does not interfere with magnetic fields is preferred. By way of example, component rods 216a, 216b may be formed from silicon carbide or from a ceramic material. Other materials which may not have the specific stiffness of silicon carbide, e.g., aluminum, may also be suitable for use in forming component rods 216a, 216b.

Reticle table 208, as shown, is sized to accommodate two reticles. In general, the number of reticles which may be scanned on reticle table 208 may be widely varied. For instance, a smaller version of reticle table 208 may be suitable for scanning a single reticle. Alternatively, a larger version of reticle table 208 may be suitable for scanning more than two reticles.

In one embodiment, reticle table 208 may be fitted with mechanisms, e.g., piezoelectric motion devices (not shown). The use of piezoelectric motion devices allows reticle table 208 to move a relatively small amount substantially independently of component rods 216a, 216b. Hence, rather than coordinating motion among linear motors which act to move overall rod 216, incremental adjustments to the position of reticle table 208 may be made through piezoelectric motion devices. Specifically, piezoelectric motion devices may be configured to allow reticle table 208 to make small translational movements along z-axis 220c, and small rotational movements about x-axis 220b and y-axis 220a.

Like component rods 216a, 216b, reticle table 208 may also be formed from a variety of different materials. Typically, reticle table 208 is formed from a ceramic material such as alumina ceramic. The formation of reticle table 208 from ceramic enables reticle table 208 to move within an electron beam projection system, for example, without significantly affecting the magnetic fields associated with the electron beam projection system. In order to substantially maximize the stiffness-to-weight ratio associated with reticle table 208, reticle table 208 may be formed as a hollow ceramic structure. A hollow reticle table 208 also enables cables and wires which are associated with reticle table 208 to be readily positioned within reticle table 208.

As mentioned above, overall rod 216 may be translated along y-axis 220a through the use of rod 222, which may be positioned within sleeve 218. FIG. 4 is a diagrammatic representation of rod 222 and sleeve 218, as shown in FIG. 2, in accordance with an embodiment of the present invention. Rod 222 is positioned within sleeve 218, which is essentially a connection point between component rods 216a, 216b. In one embodiment, sleeve 218 may be considered to be a sleeve bearing as the interior of sleeve 218 is effectively a bearing surface for rod 222.

Rod 222 is coupled, e.g., attached, at each end to a coil 226 and a magnet track 230. Coils 226 and magnet tracks 230 cooperate to enable rod 222 to translate along y-axis 220a. At one end, rod 222 is also coupled to a coil 404 and a coil 408. Coil 408 is positioned substantially parallel to coil 226a, while coil 404 is positioned substantially perpendicular to coil 226a, as shown. Coil 404 is part of an overall voice coil motor that is arranged to provide rod 222 with translational motion with respect to z-axis 220c, as well as rotational motion with respect to y-axis 220a. Coil 408 is a part of a voice coil motor that enables rod 222 to translate along x-axis 220b. Coil 408 effectively stabilizes the x-position of rod 222 without the need of mechanical guides. At another end, rod 222 is coupled to coil 226b, as well as coils 412, 414. Coils 412, 414 are positioned to be substantially perpendicular to coil 226b, as shown. Coils 414, 414 are part of at least one voice coil motor which allows rod 222 to translate along z-axis 220c, and to rotate about both x-axis 220b and y-axis 220a.

When active, the voice coil motors associated with coil 404, coil 412, and coil 414 effectively cooperate with coils 226 and magnet tracks 230 to enable rod 222 to move along z-axis 220c and rotate about y-axis 220a. The voice coil motor associated with coils 412, 414 also cooperates with coils 226 and magnet tracks 230 to enable rod 220 to rotate about x-axis 220b. The voice coil motor associated with coil 408 may cooperate with coils 226 and magnet tracks 230 to prevent rod 222 from translating with respect to x-axis 220b.

When rod 222 moves along z-axis 220c, rod 216c also moves along z-axis 220c. In one embodiment, plates 228 of FIG. 2 are arranged to translate along z-axis 220c when rod 216 translates along z-axis 220c. In other words, plates 228, in addition to sleeves 224, also undergo movement with respect to z-axis 220c, i.e., plates 228 may be driven in a z-direction along z-axis 220c. By way of example, when rod 216 is displaced along z-axis 220c, rod 216 may cause sleeves 224 to also pull or push plates 228 along z-axis 220c.

Figure 5:
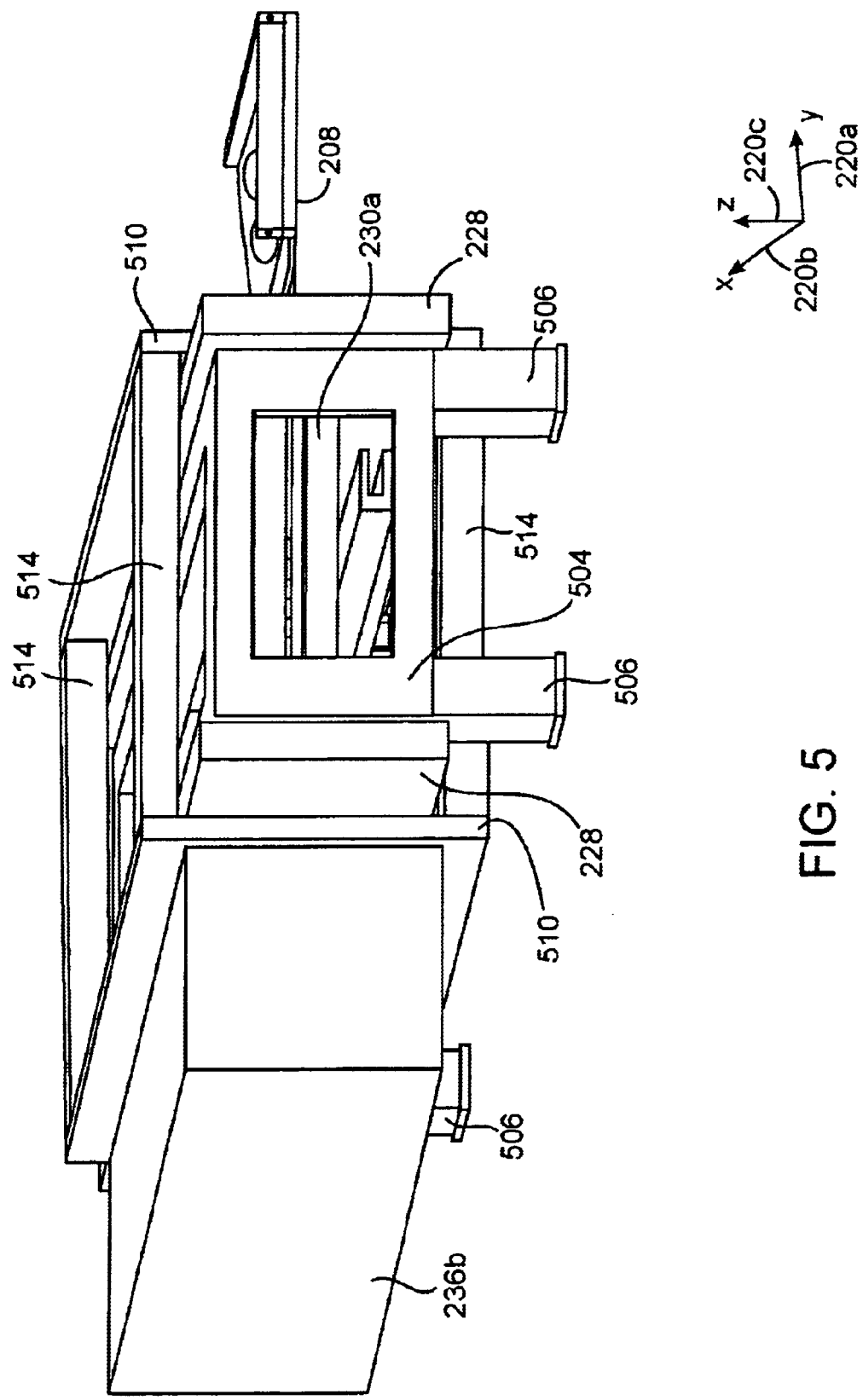
FIG. 5 is a diagrammatic representation of a reaction frame that is arranged to support a stage device, e.g., stage device 204 of FIG. 2, in accordance with an embodiment of the present invention.

In general, stage device 204 of FIG. 2 may be supported such that plate 228a may be held against wall 232a of vacuum chamber 236. One embodiment of a support, e.g., a reaction frame, is shown in FIG. 5. A reaction frame 504 is arranged to support stage device 204 of FIG. 2 such that reaction forces associated with the stage device may be dissipated. Substantially all linear motors associated with stage device 204, as for example the linear motor which includes magnet track 230a, may be supported by reaction frame 504. In the embodiment as shown, reaction frame includes legs 506 that may be attached rigidly to a surface, e.g., a ground surface, to enable reaction forces associated with the linear motors of stage device 204 to be dissipated into the ground surface. The dissipation of the reaction forces serves to substantially minimize the disturbances transmitted to precision components associated with a vacuum chamber, e.g., vacuum chamber 236a of FIG. 2, in which reticle table 208 is positioned.

Reaction frame 504 may cooperate with fixed bearing plates 510 to effectively constrain plates 228 from significantly moving along either y-axis 220a or z-axis 220c. Pressure balancing struts 514 positioned between fixed bearing plates 510 serve to balance pressure associated with fixed bearing plates 510. In other words, pressure balancing struts 514 effectively serve to counteract pressure exerted on fixed bearing plates 510 by the vacuums in chamber 236b and the chamber in which reticle table 208 is typically positioned, i.e., vacuum chamber 236a of FIG. 2.

Figure 6:
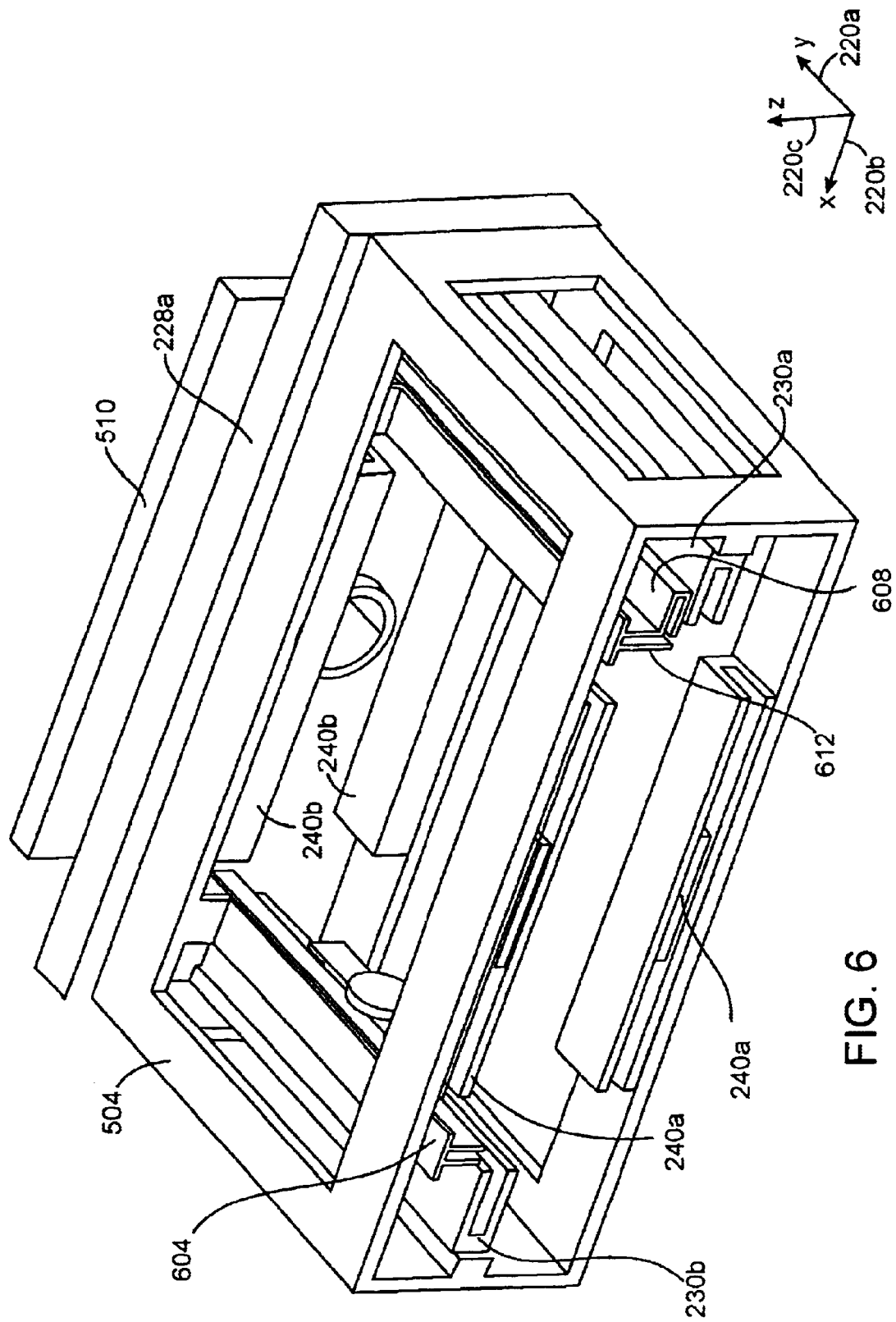
FIG. 6 is a diagrammatic representation of a portion of a reaction frame, e.g., reaction frame 504 of FIG. 5, in accordance with an embodiment of the present invention.

FIG. 6 is a diagrammatic representation of a portion of reaction frame 504 of FIG. 5 in accordance with an embodiment of the present invention. As previously mentioned, linear motors associated with stage device 204 of FIG. 2 are generally mounted on reaction frame 504 to allow reaction frame 504 to dissipate reaction forces associated with the linear motors. For ease of illustration although many other components including, but not limited to, rods 216, 220 are effectively supported by reaction frame 504, these components are not shown in FIG. 6 for purposes of illustration.

Linear motors 240 which drive plates 228, as shown in FIG. 5, are mounted to reaction frame 504. A magnet track 604, which accommodates coils 412, 414 of FIG. 4 to form at least a part of a linear motor, is mounted to reaction frame 504, as is magnet track 230b which accommodates coil 226a, as shown in FIG. 2. Similarly, magnet track 608 and magnet track 612, which accommodate coil 408 and coil 404, respectively, are also mounted to reaction frame 504. It should be appreciated that although magnet tracks 608, 612 are shown as being integrally formed, magnet tracks 608, 612 may also be formed from substantially individual pieces which are separately mounted to reaction frame 504.

Figure 7:
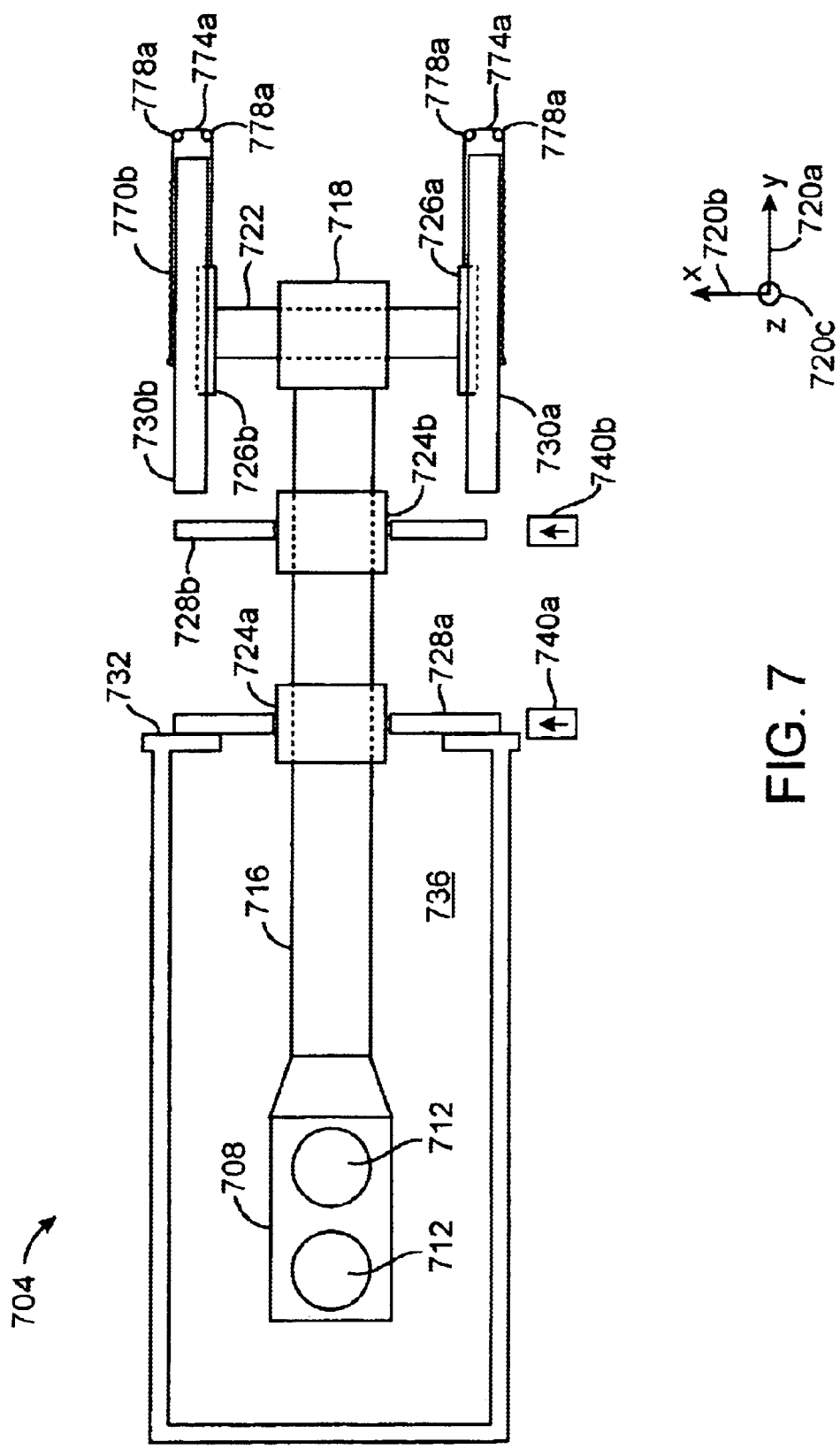
FIG. 7 is a diagrammatic top-view schematic representation of a scanning stage device which includes springs, cables, and pulleys in accordance with a second embodiment of the present invention.

The overall design of a stage device which does not place linear motors or magnetic elements within a system vacuum chamber may vary. That is, elements included in an overall design may vary. By way of example, while the stage device of FIG. 2 includes a dummy chamber which is used to counteract the force on a rod, i.e., rod 216, caused by atmospheric pressure, it should be appreciated that a variety of other devices and arrangements may also be used to counteract the force on the rod. For example, an arrangement which uses springs, cables, and pulleys may be used to substantially counteract the tendency of the rod from being pulled into a system vacuum chamber. FIG. 7 is a diagrammatic top-view schematic representation of a scanning stage device which includes springs, cables, and pulleys in accordance with a second embodiment of the present invention. A scanning stage device 704 includes components similar to those of scanning stage device 204 of FIG. 2. Stage device 704 includes a reticle table 708 on which reticles 712 may be mounted. Reticle table 708 is carried on a rod 716 which is arranged to translate along a y-axis 720a such that reticle table 708 may be scanned along y-axis 720a. One embodiment of rod 716 and reticle table 708 will be discussed below with reference to FIG. 8.

One end of rod 716 is coupled to a sleeve 718 within which a bar 722 or a shaft which has a central axis aligned along an x-axis 720b may be positioned. Each end of bar 722 is effectively coupled to a linear motor, e.g., a voice coil motor, which includes a coil 726 and a magnet track 730. Coils 726 and magnet tracks 730 cooperate to control the linear position of bar 722 along y-axis 720a. When bar 722 translates along y-axis 720a, rod 716 also translates along y-axis 720a. Coil 726a and magnet track 730a may be differentially controlled with respect to coil 726b and magnet track 730b to at least partially control the rotational position of bar 722 and rod 716 about a z-axis 720c. Each end of bar 722, in addition to being coupled to coils 726, may also be coupled to additional linear motors. These additional linear motors may control any combination of translational motion of bar 722 along z-axis 720c, slight rotational motion about y-axis 720b, and slight rotational motion about x-axis 720b.

In the described embodiment, rod 716 is supported by sleeves 724 which, in turn, are each supported by a plate 728. Sleeves 724 are positioned and configured such that rod 716 may slide through sleeves 724. Plate 728a, which is vertically oriented along x-axis 720b, as is plate 728b, may be supported against wall 732 of system vacuum chamber 736 by air bearings under plate 728a. Plate 728a is typically held against wall 732 by a vacuum force provided by chamber 736. The air bearing surface under plate 728a may move along guides (not shown) associated with walls 732, and will be described below with respect to FIG. 11. The use of air bearings which are positioned substantially external to vacuum chamber 736 reduces the amount of gas which may be leaked into vacuum chamber 736, as discussed above.

Due to atmospheric pressure causing forces which act to pull rod 716 into chamber 736, a mechanism which counteracts the forces on rod 716 may be included in stage device 704. Stage device 204 of FIG. 2 included dummy chamber 236b to counteract forces on rod 216 and, hence, prevent rod 216 from being pulled into or pushed into vacuum chamber 236a. Although the use of a dummy chamber is effective in counteracting forces on a rod, a dummy chamber may, in some cases, be inconvenient to maintain.

A force counteractor or mechanism which does not require the use of a dummy chamber may include a combination of springs 770, cables 774, and pulleys 778. Cables 774 may be coupled to magnets 726, and arranged to be pulled over pulleys 778 by fixed springs 770. In one embodiment, springs 770 may be constant force springs. Although the force which has the tendency to pull rod 716 into chamber 736 may vary widely, the force is often less than approximately 400 pounds. Hence, springs 770, cables 774, and pulleys 778 may be arranged to counteract approximately 400 pounds, e.g., springs 770 may be rated at approximately 400 pounds.

In addition to being effective for counteracting forces on rod 716, the use of springs 770, cables 774, and pulleys 778 allows the size of rod 716 to be reduced. That is, the use of springs 770, cables 774, and pulleys 778 to counteract forces, in lieu of a dummy chamber, allows the mass that is moved as well as the overall length of rod 716 to be at least slightly reduced. The length and, hence, the mass may be reduced since an end of rod 716 does not need to protrude into a dummy chamber. However, the use of springs 770, cables 774, and pulleys 778 may introduce disturbances, e.g., vibrations, into stage device 704. Hence, vibration dampening devices (not shown) may be added to stage device 704 to compensate for vibrations.

Typically, when a force counteractor which includes springs 770, cables 774, and pulleys 778 is used to counteract atmospheric pressure forces on rod 716, the space between plates 728 may be smaller than the space between plates for a stage device which utilizes a dummy chamber to counteract atmospheric pressure forces on a rod. While the decrease in spacing between plates 728 allows stage device 704 to be more compact, the resonant mechanical modes of rod 716 may be lowered, as will be appreciated by those skilled in the art. If the lowering of the resonant mechanical modes significantly reduces the precision of stage device 704, then the spacing between plates 728 may be increased until the precision of stage device 704 is considered to be acceptable.

Figure 8:
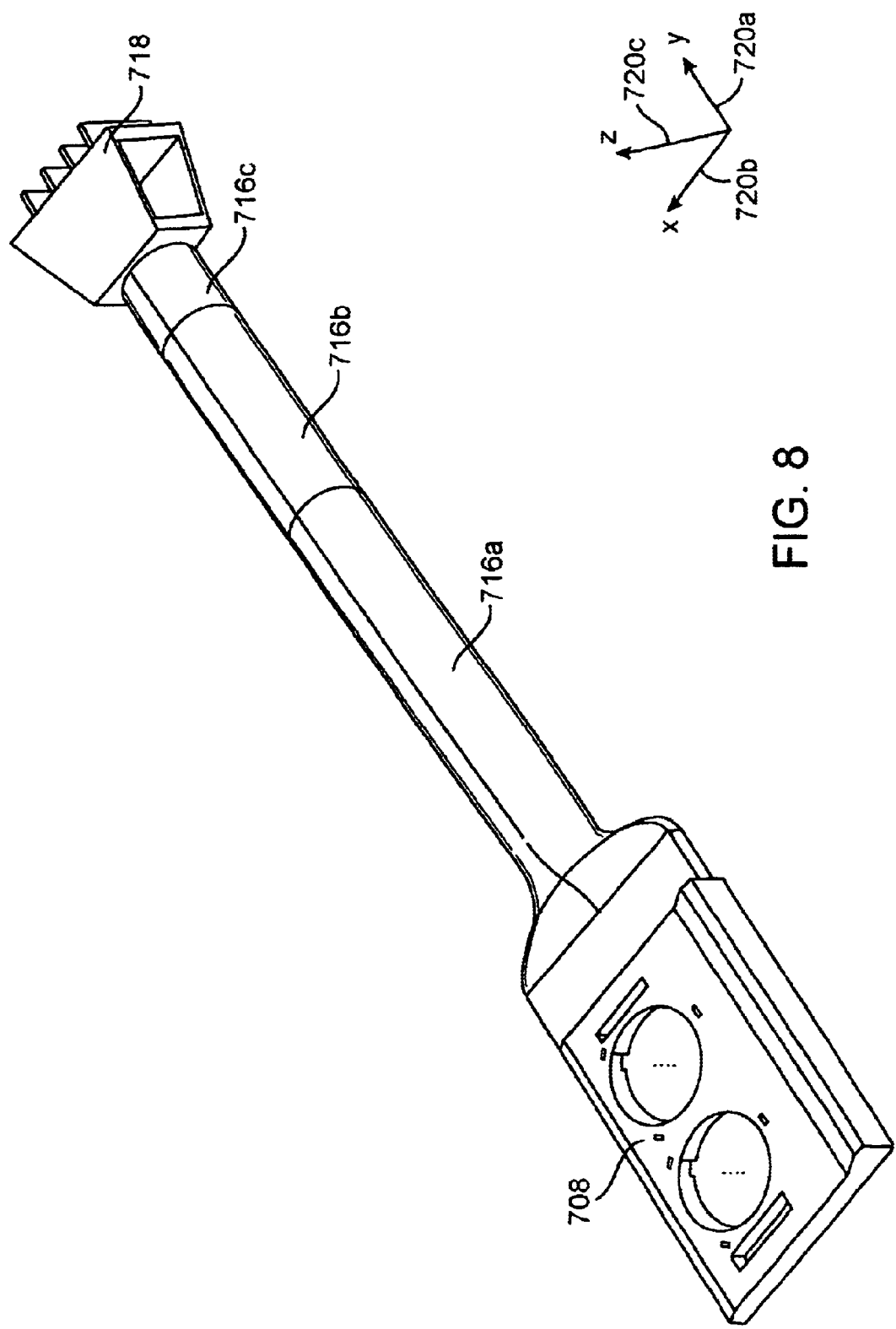
FIG. 8 is a diagrammatic representation of a rod, a reticle table, and a sleeve, e.g., rod 716, reticle table 708, and sleeve 718 of FIG. 7, in accordance with a second embodiment of the present invention.

FIG. 8 is a diagrammatic representation of a rod, a reticle table, and a sleeve, i.e., rod 716, reticle table 708, and sleeve 718 of FIG. 7, in accordance with the second embodiment of the present invention. Rod 716 may be formed from component rods 716a–c, which may be joined together using adhesives, welds, or mechanical fasteners. The use of component rods 716a–c, in lieu of a single rod, may increase the stiffness of overall rod 716. It should be appreciated, however, that overall rod 716 may be formed from a single rod. As shown, component rods 716a–c are connected in line with their central axes with respect to y-axis 720a.

Component rods 716a–c may be solid, although component rods 716a–c are often formed as hollow rods. While component rods 716a–c typically have round, e.g., circular, cross-sections, component rods 716a–c may instead have substantially rectangular cross-sections. Typically, component rods 716a–c may be formed from a material with a relatively high specific stiffness, such as silicon carbide.

Reticle table 708, like reticle table 208, as discussed above with respect to FIG. 2, may be sized to accommodate any number of reticles. In one embodiment, reticle table 708 may be fitted with mechanisms, e.g., piezoelectric motion devices (not shown) which enable reticle table 708 to move a relatively small amount substantially independently of component rods 716a–c.

Sleeve 718, which is positioned at the opposite end of overall rod 716 from reticle table 708, is arranged to accommodate bar 722 of FIG. 7. Bar 722 is arranged to slide within sleeve 718, which provides a relatively flat bearing surface on which bar 722 may slide. Although sleeve 718 is arranged to accommodate a bar with a substantially rectangular cross section, it should be appreciated that sleeve 718 may instead be arranged to accommodate a bar with a substantially circular cross-section.

Figure 9:
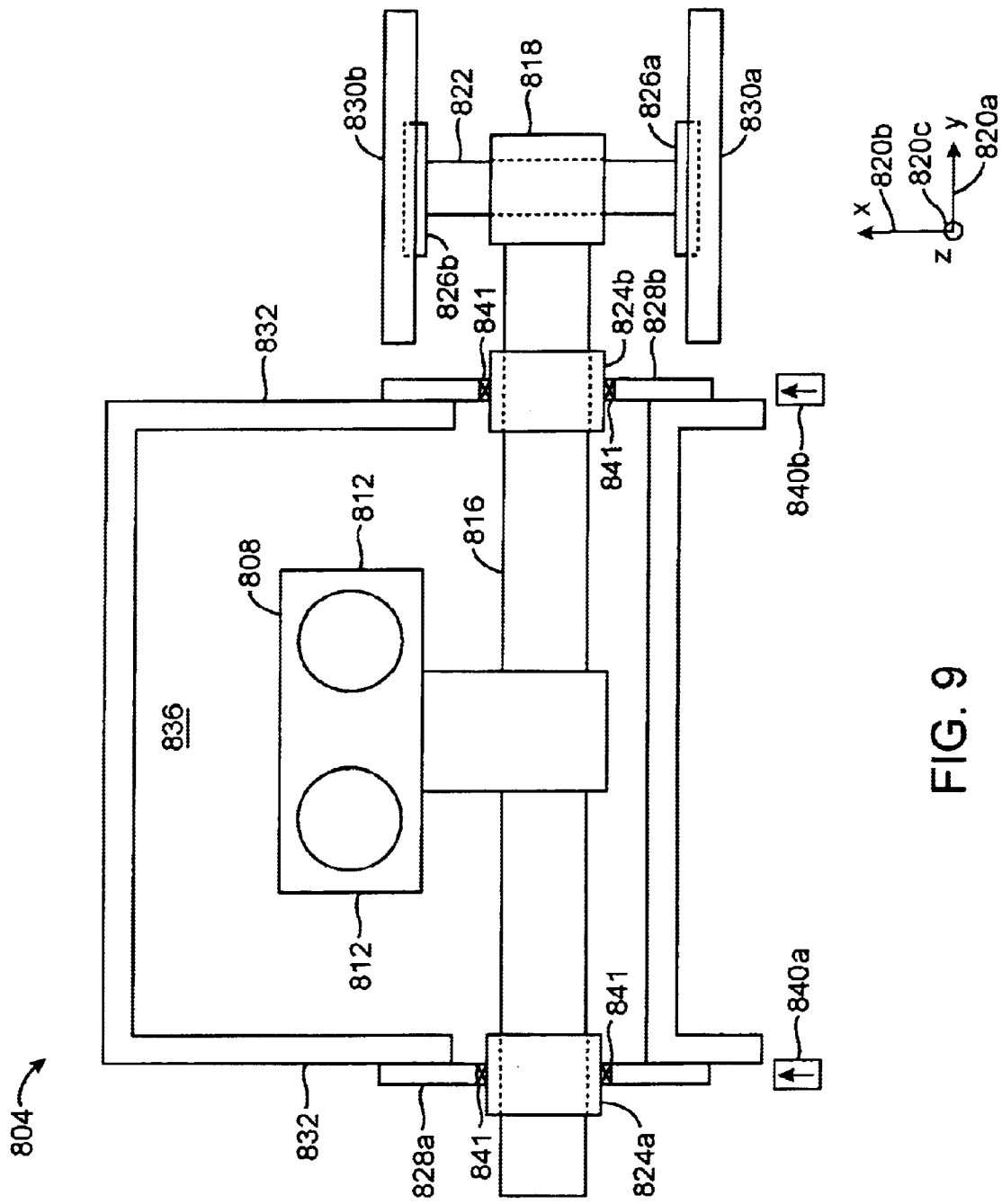
FIG. 9 is a diagrammatic top-view schematic representation of a compact scanning stage device in accordance with a third embodiment of the present invention.

Referring next to FIG. 9, still another scanning stage device which substantially isolates moving metals and linear motors from a system vacuum chamber will be described in accordance with a third embodiment of the present invention. Unlike stage device 704 of FIG. 7 and stage device 204 of FIG. 2, a scanning stage device 804 does not include a reticle table which is positioned at an end of a translating rod. Instead, stage device 804 includes a reticle table 808 which is effectively cantilevered off of a rod 816 which is arranged to translate along a y-axis 820a. That is, reticle table 808 is coupled to rod 816, but reticles 812 which are held by reticle table 808 are offset from rod 816 along an x-axis 820b. Rod 816 and reticle table 808 are described in more detail below with respect to FIG. 10.

One end of rod 816 is coupled to a sleeve 818 through which a rod 822 may slide. Rod 822 is arranged to translate in an y-direction along a y-axis 820a. Each end of rod 822 is coupled to a linear motor, which includes a coil 826 and a magnet track 830, that operates to move both rod 822 and, hence, rod 816 and reticle table 808, along y-axis 820a. Differentially controlling the linear motors at either end of rod 822 allows rotation to be controlled about a z-axis 820c. The stroke of rod 816 along y-axis 820a may generally be widely varied depending upon the overall requirements of stage device 804. In one embodiment, the stroke of rod 816 along y-axis 820a may be up to approximately 600 mm.

Rod 816 is supported by sleeves 824 which, in turn, are each supported by a plate 828. Rod 816 may slide within sleeves 824 when rod 816 translates with respect to y-axis 820a. Plates 828, which are vertically oriented along x-axis 820b, may be supported against opposing walls 832 of a system vacuum chamber 836 by air bearings under plates 828. Plates 828 are generally held against walls 832 by vacuum forces which may be provided through the air bearings under plates 828. That is, at least part of each plate 828 is effectively sealed against walls 832. The air bearings under plates 828 may move along walls 832 or, more specifically, along guides associated with walls 832. One suitable air bearing configuration that is used with plates 828 will be described below with respect to FIG. 11.

Linear motors 840 may be implemented to drive plates 828 along x-axis 820b and, as a result, displace rod 816 along x-axis 220b. The stroke of rod 816 along x-axis 820b may vary depending upon the overall requirements of stage device 804. In the described embodiment, rod 816 has a stroke along x-axis 820b of up to approximately 85 mm. Differential motion of plates 828 may cause a relatively small rotation of rod 816 about x-axis 820b. Flexures such as flexure bellows 841 or diaphragms may be positioned between sleeves 824 and plates 828 to enable sleeves 824 and rod 816 to twist, or to rotate slightly about x-axis 820b and z-axis 820c.

In one embodiment, at least one linear motor 840 may be mounted on a support which includes an actuator that provides an ability for rod 816 to be translated with respect to z-axis 820c. For example, linear motors 840, as well as magnet tracks 830 and magnet tracks 604 of FIG. 6, may be mounted on a support structure which has an actuator that allows linear motors 840 and magnet tracks 830 to move along z-axis 820. Moving linear motors 840 and magnet tracks 830 along z-axis enables reticle table 808 to be adjusted within vacuum chamber 836 with respect to z-axis 820c.

Stage device 804 is configured to substantially position linear motors such as linear motors 840 which allow movement along x-axis 820b, as well as linear motors for movement along y-direction 820a which include coils 826 and magnet tracks 830, out of vacuum chamber 836. While stage device 804 may be smaller or more compact than, for example, stage device 204 of FIG. 2, stage device 804 may have more gas leakage into vacuum chamber 836 than stage device 204, as the perimeter of air bearing seals in stage device 804 is approximately doubled from the perimeter of air bearing seals in stage device 204. In other words, two plates 828 with air bearings are sealed against walls 832 of vacuum chamber 836, while one plate with air bearings is sealed against walls of a vacuum chamber in stage device 204 of FIG. 2.

Figure 10:
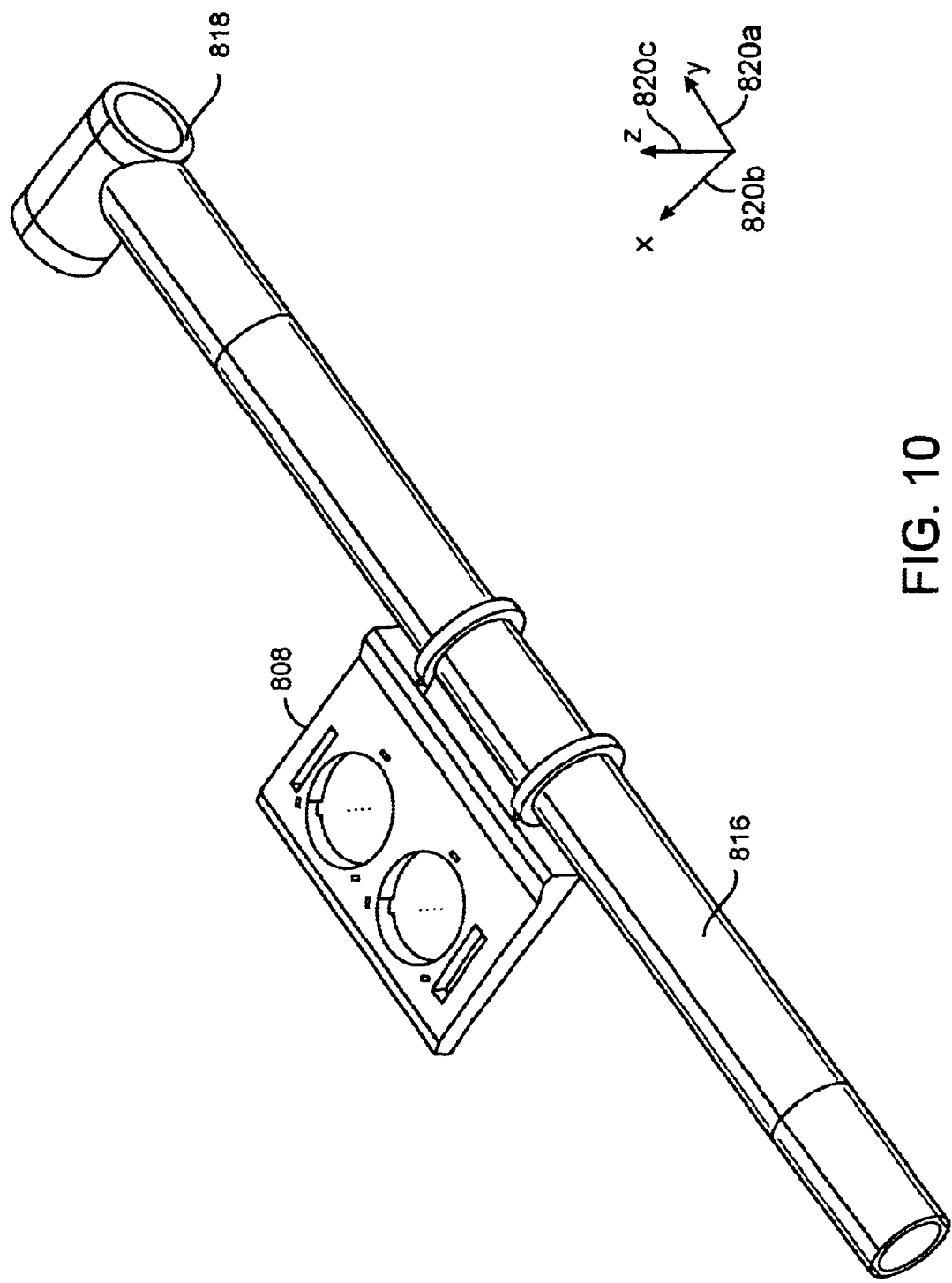
FIG. 10 is a diagrammatic representation of a rod, a reticle table, and a sleeve, e.g., rod 816, reticle table 808, and sleeve 818 of FIG. 9, in accordance with a third embodiment of the present invention.

FIG. 10 is a diagrammatic representation of rod 816, reticle table 808, and sleeve 818 in accordance with the third embodiment of the present invention. Rod 816 may be formed as a single rod, or rod 816 may be formed from a plurality of component rods. While rod 816 may be solid, rod 816 is often formed as a hollow rod, as hollow rods are relatively lightweight, and allow substantially any cables or wires which carry signals between reticle table 808 and external controllers or devices to be routed through rod 816. Routing cables and wires through rod 816 prevents cables and wires from having to be maintained within a vacuum.

Reticle table 808 is cantilevered off of rod 816 such that reticle table 808 is not positioned at an end of rod 816. Although the effective offset between reticle table 808 and a central axis of rod 816 may cause a moment about the central axis of rod 816, the positioning of reticle table 808 enables the overall size of stage device 804 of FIG. 9 to be reduced. It should be appreciated, however, that the positioning of reticle table 808 may generally vary.

Typically, a material with a relatively high specific stiffness which does not interfere with magnetic fields is used to form rod 816. Suitable materials include, but are not limited to, silicon carbide or a ceramic material. Like component rod 816, reticle table 808 may also be formed from a variety of different materials. By way of example, reticle table 808 may be formed from a ceramic material such as alumina ceramic. To substantially maximize the stiffness-to-weight ratio associated with reticle table 808, reticle table 808 may be formed as a hollow ceramic structure.

Sleeve 818 is positioned at an end of rod 816, and, as discussed above, is arranged to accommodate rod 822 of FIG. 9 which is coupled to linear motors. Sleeve 818 enables rod 816 to effectively slide over rod 822 when reticle table 808 is translated along x-axis 820b. Sleeve 818 also enables movement of rod 822 along y-axis 820a to displace reticle table 808 along y-axis 820a.

Figure 11:
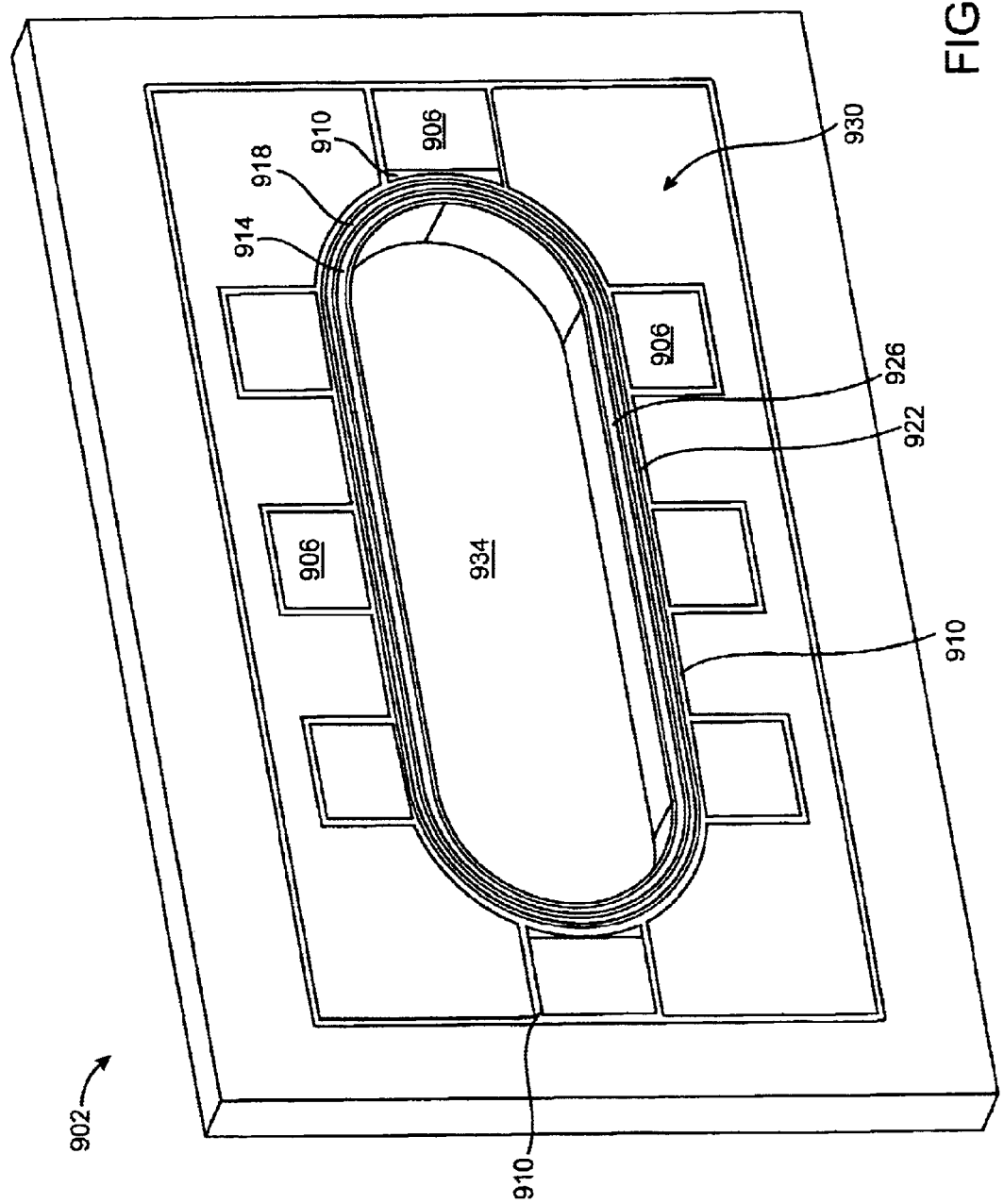
FIG. 11 is a diagrammatic representation of an air bearing which is suitable for use with a scanning stage in accordance with an embodiment of the present invention.

As previously mentioned, plates such as plates 228 of FIG. 2, plate 728a of FIG. 7, and plates 828 of FIG. 8, have air bearing surfaces which seal against walls, e.g., walls of a vacuum chamber. In general, substantially any suitable air bearing surface design which minimizes leakage of air into a vacuum chamber may be used. With reference to FIG. 11, one suitable air bearing will be described in accordance with an embodiment of the present invention. An air bearing configuration 902, which is arranged to be positioned on one side of a plate that supports sleeves in a stage device such as stage device 204 of FIG. 2, includes air pads 906. Air pads 906 are surrounded by a grooves 910 through which gas at approximately atmospheric pressure, i.e., approximately 15 pounds per square inch (psi) may flow. Maintaining grooves 910 at approximately atmospheric pressure allows air pads 906, which may be coupled to an air supply that typically supplies air, e.g., air at a pressure of between approximately 60 psi and 80 psi, to effectively operate in a non-vacuum environment. Typically, grooves 910 may be vented directly to atmospheric pressure through ports (not shown).

Configuration 902 also includes high vacuum grooves 914 and low vacuum grooves 918, which may serve as air-flow evacuation stages or channels. Lands 922 separate grooves 910 from low vacuum grooves 918. In general, lands 922 each have substantially the same height, or thickness, as air pads 906. Lands 922, in cooperation with a guide surface on the outside of a chamber, e.g., walls 232 of FIG. 2, essentially create a flow restriction which serves to reduce the leakage flow from grooves 910 to grooves 918. Similarly, lands 926 separate grooves 918 from high vacuum grooves 914. High vacuum grooves 914 generally contain a vacuum on the order of approximately 10 e$^{-4}$ Torr.

Configuration 902 has a bearing vacuum preload area 930 which is used to provide preload force to the configuration 902 during testing of the stage of which configuration 902 is a part when there is no vacuum in the chamber. It should be appreciated that bearing vacuum preload area 930 is generally not used in normal operation because a vacuum area 934 provides the necessary preload force during normal operation. During normal operation, bearing vacuum preload area 930 is substantially open to the atmosphere.

In general, configuration 902 does not leak a significant amount and, hence, may be used in proximity to a vacuum chamber without causing significant contamination in the vacuum chamber. That is, configuration 902 is vacuum compatible. Grooves 914, 918, or evacuation stages, which are incorporated into configuration effectively reduce the volume of gas which reaches the vacuum chamber and the volume of gas that is pumped out of the vacuum chamber. Each air pad 906 is surrounded by a channel or groove 910 which is vented substantially directly to atmospheric pressure. Hence, each air pad 906 may effectively operate as if it were in a non-vacuum environment. Therefore, configuration 902 is able to operate effectively with an essentially negligible amount of friction, a relatively high stiffness, and low noise.

Figure 12A:
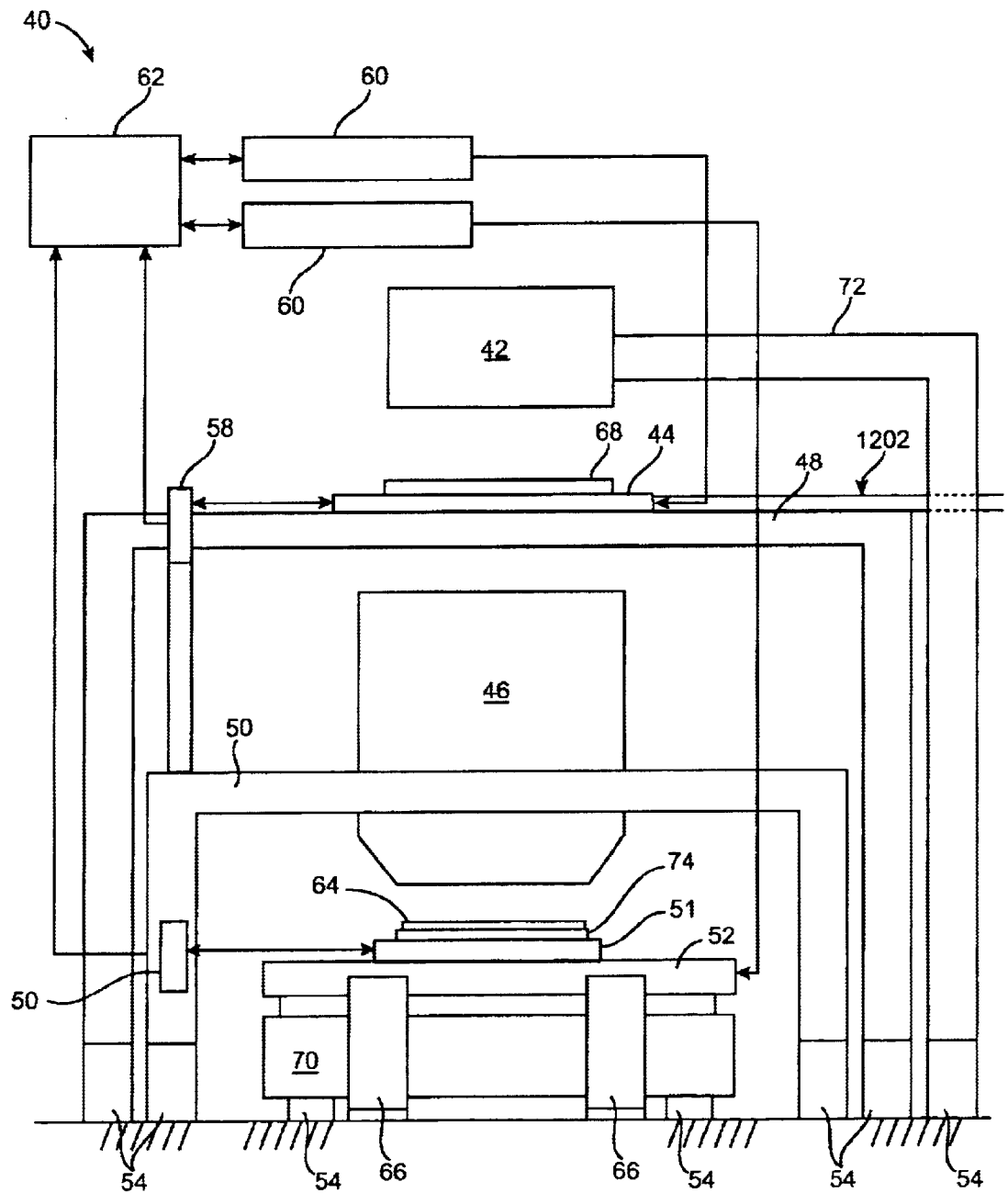
FIG. 12a is a diagrammatic representation of a photolithography apparatus which has vibrations that may be dampened by a diaphragm chamber in accordance with an embodiment of the present invention.
Figure 12A:
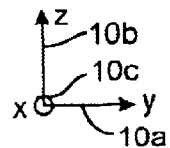

A vacuum compatible air bearing stage may be used as a part of a photolithography machine. With reference to FIG. 12a, a photolithography apparatus which includes a vacuum compatible stage device will be described in accordance with an embodiment of the present invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator.

The planar motor which drives wafer positioning stage 52 generally uses an electromagnetic force generated by magnets and corresponding armature coils arranged in two dimensions. A wafer 64 is held in place on a wafer holder 74 which is coupled to wafer table 51. Wafer positioning stage 52 is arranged to move in multiple degrees of freedom, e.g., between three to six degrees of freedom, under the control of a control unit 60 and a system controller 62. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

Figure 12B:
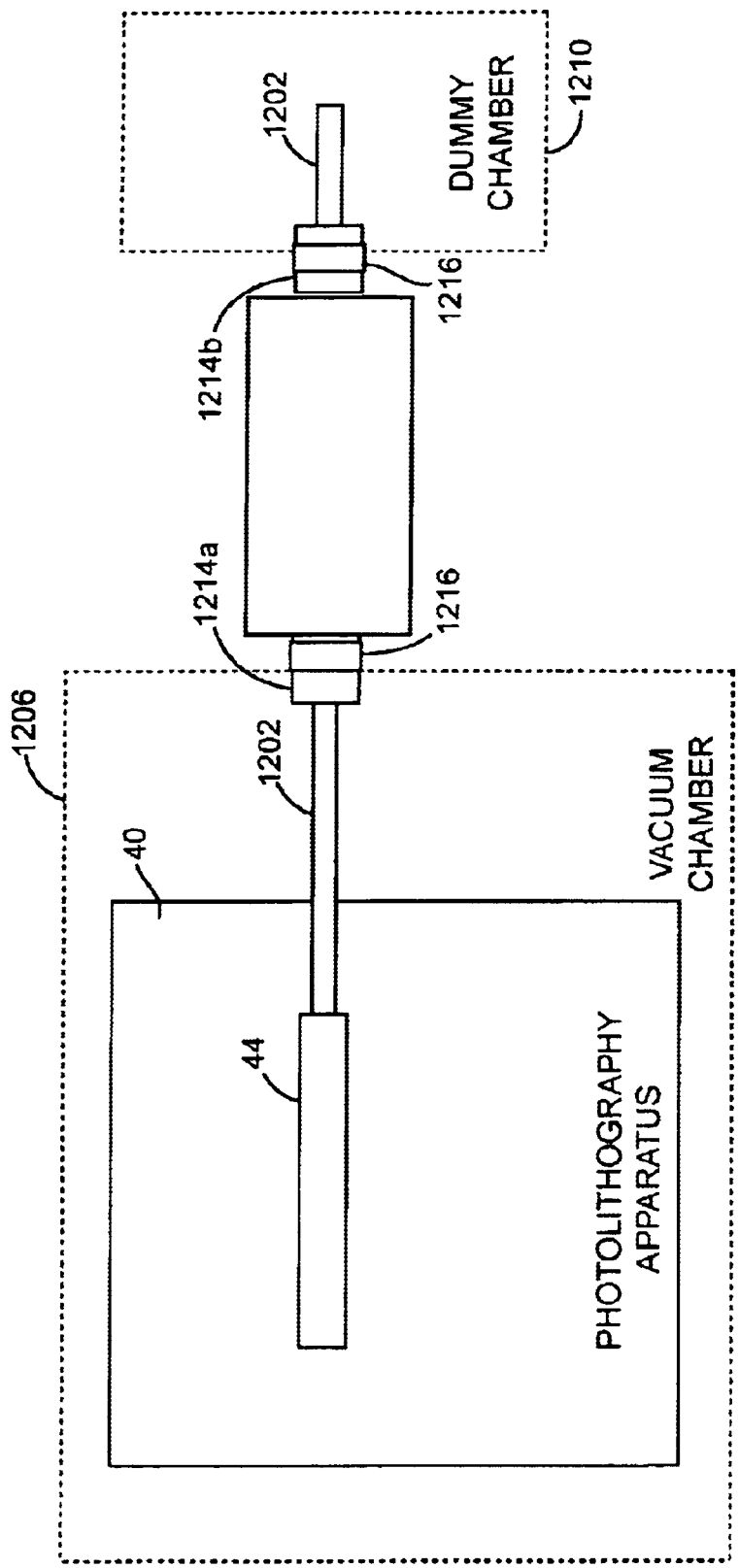
FIG. 12b is a diagrammatic block diagram representation of a system which includes a photolithography apparatus, i.e., photolithography apparatus 40 of FIG. 12, that uses a reticle stage which utilizes a dummy chamber.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle table 208 which, in the described embodiment, is part of an overall vacuum compatible stage that also includes a rod 1202. Reticle table 208 and, in general, apparatus 40 are positioned within a vacuum chamber 1206, as shown in FIG. 12b. Rod 1202, which may be similar to rod 216 of FIG. 2, extends through vacuum chamber 1206 and terminates in a dummy chamber 1210, also as shown in FIG. 12b. In one embodiment, rod 1202 passes through sleeves 1214 which are supported by plates 1216.

Reticle table 44 may be supported on a reticle table frame 48. The radiant energy is focused through projection optical system 46, which is supported on a projection optics frame 50 and may be released to the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optics frame 50, and detects the position of reticle table 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 using reticle table 44. Wafer 64 is moved perpendicularly to the optical axis of projection optical system 46 by a wafer positioning stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head. Further, photolithography apparatus 40 which uses a vacuum compatible reticle stage that includes reticle table 44 may also be a part of a proximity photolithography system that exposes a mask pattern by closely locating a mask and a substrate without the use of a lens assembly.

The illumination source of illumination system 42 may be g-line (436 nanometers (nm)), i-line (365 nm), a KrF excimer laser (248 nm), a ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays are preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coils in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

As described above, a photolithography system according to the above-described embodiments may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 13:
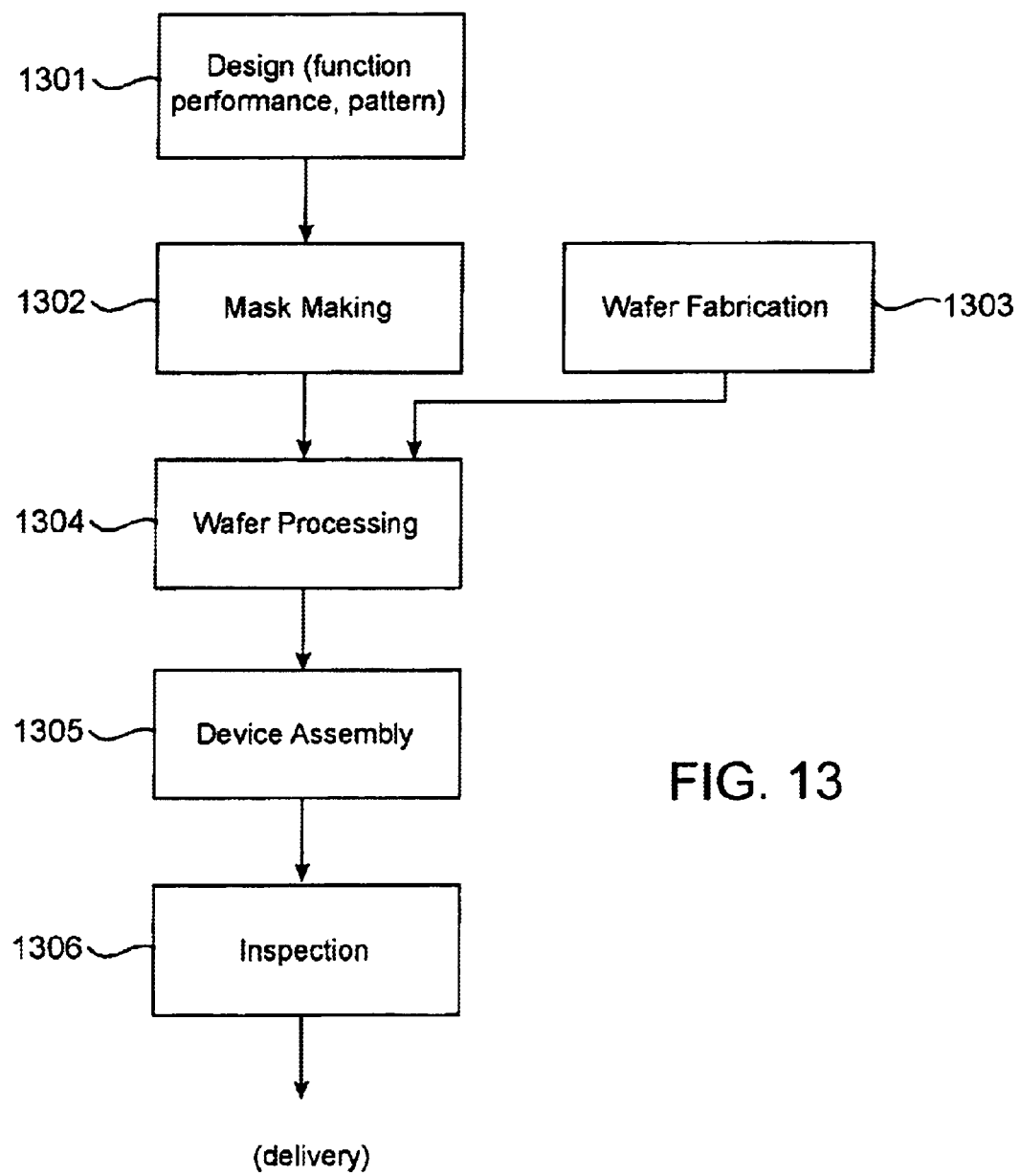
FIG. 13 is a process flow diagram which illustrates the steps associated with fabricating a semiconductor device in accordance with an embodiment of the present invention.

Further, semiconductor devices may be fabricated using systems described above, as will be discussed with reference to FIG. 13. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system that includes a reticle scanning stage which is vacuum compatible. One process of exposing a mask pattern onto a wafer will be described below with respect to FIG. 14. In step 1305, the semiconductor device is assembled. The assembly of the semiconductor device generally includes, but is not limited to, wafer dicing processes, bonding processes, and packaging processes. Finally, the completed device is inspected in step 1306.

Figure 14:
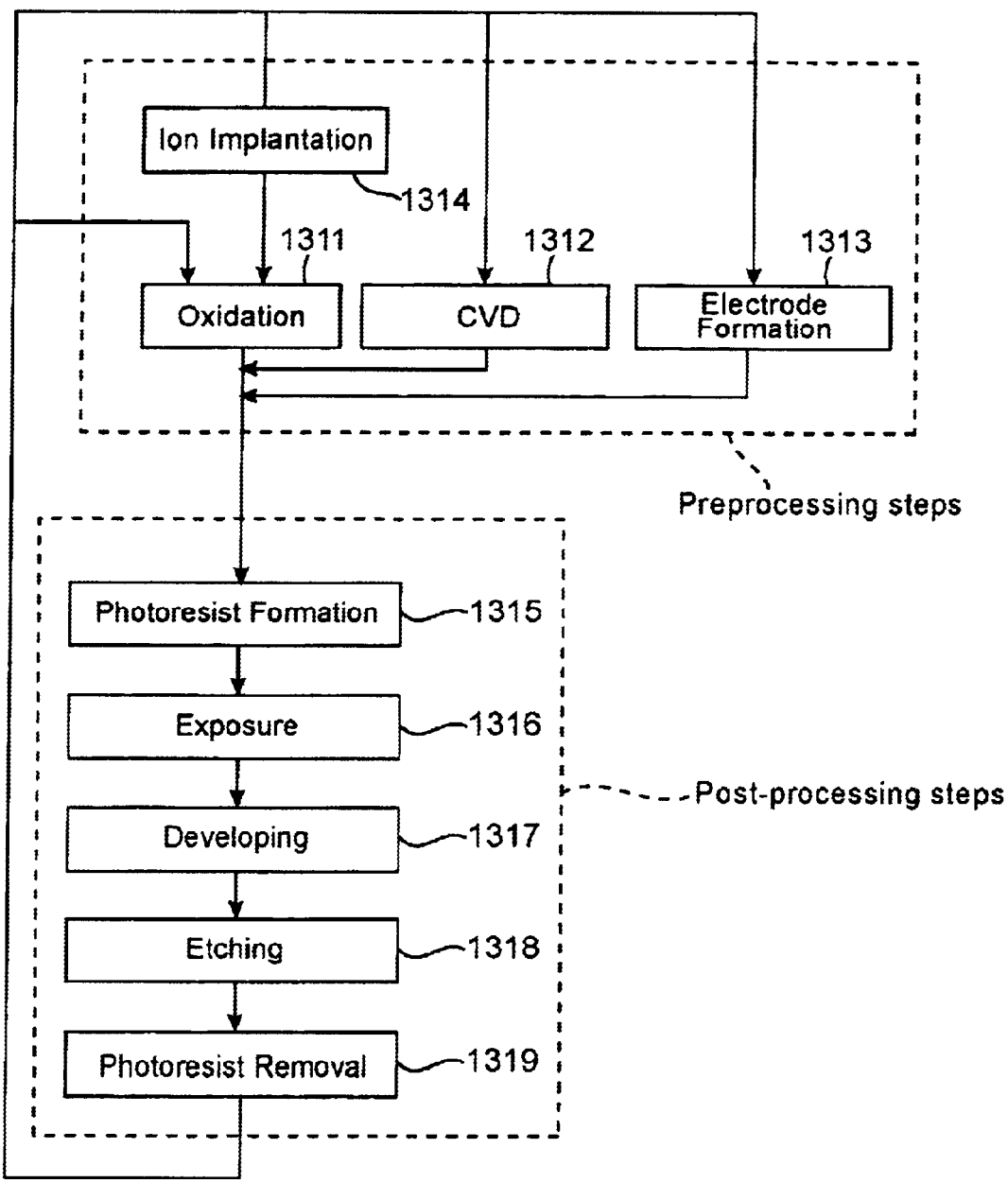
FIG. 14 is a process flow diagram which illustrates the steps associated with processing a wafer, i.e., step 1304 of FIG. 12, in accordance with an embodiment of the present invention.

FIG. 14 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, be a vacuum compatible stage such as stage 204 of FIG. 2.

After the circuit pattern on a reticle is transferred to a wafer, the exposed wafer is developed in step 1317. Once the exposed wafer is developed, parts other than residual photoresist, e.g., the exposed material surface, may be removed by etching in step 1318. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while a scanning stage device described as being suitable for use in a vacuum chamber associated with an electron beam projection system. It should be appreciated, however, that the scanning stages described above may be used as a part of substantially any suitable system which uses a vacuum environment. Suitable systems include, but are not limited to, ion beam projection lithography systems and extended ultraviolet lithography systems. Alternatively, the scanning stages of the present invention may also be implemented in systems which do not use vacuum environments.

While a system such as an extended ultraviolet lithography system is generally not sensitive to magnetic fields, a scanning stage device such as those described above in an extended ultraviolet lithography system may be beneficial. For example, the stage devices of the present invention reduce gas leakage into a system vacuum chamber, and enable linear motors to be readily maintained, as the linear motors are positioned outside of the system vacuum chamber.

A stage which has effectively no linear motors or magnetic elements within a system vacuum chamber has generally been described as being suitable for scanning a reticle table. That is, the stages described above have been described as being suitable for use to scan a reticle or reticles within a system chamber. It should be understood that the stages described above may generally be used to scan a variety of different objects. For example, the stages may be slightly modified to accommodate semiconductor wafers instead of reticles.

A rod which carries a reticle table may generally be formed from two or more component rods. The use of more than one rod to from an overall rod to carry a reticle table may be desirable, for instance, to facilitate the installation of a sleeve along the span of the overall rod, e.g., as described above with respect to FIGS. 2 and 3. The number of rods used to form an overall rod may vary widely. In some instances, the overall rod may be formed from a single rod. Alternatively, multiple rods may be attached together to form an overall rod.

As described above with respect to FIG. 9, a reticle table may be cantilevered with respect to a rod that is arranged to scan in a y-direction. It should be appreciated that the reticle tables of FIGS. 2 and 7 may also be cantilevered or otherwise offset from a rod without departing from the spirit or the scope of the present invention. The cantilevering of a reticle table allows the length of rod to be shortened and, hence, reduces the overall dimensions of the scanning device. However, shortening the length of rod by cantilevering out reticle table may add a significant moment about a y-axis. This moment may add a constant load to the air bearings which support sleeves through which the rod may slide. The load associated with the moment may either be accounted for by the linear motors which drive the rod, or through the addition of a counter mass. The addition of a counter mass, in some cases, may offset the moment, but would add mass to moving portions of the stage device and, as a result, cause a reduction in the overall performance of the scanning device.

In general, the force counteracting mechanism used to compensate for atmospheric pressure forces which have the tendency to push a rod, e.g., rod 216 of FIG. 2, into a system vacuum chamber may vary. The force counteracting mechanisms include, but are not limited to, dummy vacuum chambers and arrangements which include springs, pulleys, and cables. Other force counteracting mechanisms may include motors which counteract the atmospheric pressure force, for example.

For an embodiment which uses a dummy vacuum chamber as a force counteracting mechanism, linear motors which control translational motion in a y-direction have been described as being positioned outside of a vacuum environment. It should be appreciated that the linear motors, in addition to the plates which support sleeves, may also be placed in a dummy vacuum chamber such that substantially all parts of stage device are effectively in a vacuum. The linear motors would be in positioned in the dummy vacuum chamber in which contamination is less of an issue. Positioning linear motors in the dummy vacuum chamber may lead to a need for a heat dissipator in the dummy vacuum chamber to dissipate heat generated by the linear motors. However, the plates which support sleeves and, hence, the rod which translates in a y-direction may be thinner and lighter as the plates would be subject to less bending.

While the use of air bearings has been described as being suitable for facilitating movement of a reticle table with respect to an x-axis, a variety of other mechanisms may generally be used in lieu of air bearings. By way of example, motors may be used instead of air bearings. In other words, linear motors which drive plates that include air bearings may instead drive plates which do not include air bearings. For instance, in a system in which linear motors are also contained within a dummy vacuum chamber, if leakage from the air bearings is a concern within the dummy vacuum chamber, then motors may be implemented for use instead of air bearings without departing from the spirit or the scope of the present invention.

In order to create linear motion with respect to a z-axis, a stage device may be placed on a platform which moves the stage device such that a reticle table may be adjusted within a system vacuum chamber with respect to the z-axis. Alternatively, as mentioned above, linear motors may be used to move a rod, which is aligned along a y-axis, with respect to the z-axis. Therefore, the present examples are to be considered as illustrative and not restrictive, and the invention is not to be limited to the details given herein, but may be modified within the scope of the appended claims.

What is claimed is:

1. A scanning stage apparatus comprising:
   a table, the table being arranged to be positioned in a system vacuum chamber;
   a first rod, the first rod being arranged to carry the table;
   a first wall, the first wall having a first side;
   a first plate, the first plate being arranged to support the first rod, the first plate including an air bearing surface, the air bearing surface of the first plate further being arranged to be held against the first side of the first wall by a first vacuum force;
   a second plate, the second plate being arranged to support the first rod;
   a first drive mechanism, the first drive mechanism being arranged to drive the first plate to move the first rod in a first direction, the first drive mechanism farther being arranged to drive the second plate to move the first rod in the first direction; and a second drive mechanism, the second drive mechanism including a second rod and a first linear motor, the second rod being coupled to the first rod such that the second rod is substantially perpendicular to the first rod, the second rod further being coupled to the first linear motor, wherein the first linear motor is arranged to cause the second rod to move the first rod in a second direction.

2. A scanning apparatus according to claim 1 wherein the first wall is a wall of the system vacuum chamber, and the first side of the first wall is an exterior side of the system vacuum chamber, and wherein the system vacuum chamber is arranged to maintain a vacuum level therein.

3. A scanning apparatus according to claim 2 wherein the second plate, the first drive mechanism, and the second drive mechanism are external to the system vacuum chamber.

4. A scanning stage apparatus according to claim 3 further including:

a first sleeve, the first sleeve being in contact with the first plate, the first plate being arranged to support the first rod through the first sleeve, wherein when the first drive mechanism drives the first plate to move the first rod in the first direction, the first drive mechanism drives the first plate such that the first plate moves the first sleeve and the first rod; and a second sleeve, the second sleeve being in contact with the second plate, the second plate being arranged to support the first rod through the second sleeve, wherein when the first drive mechanism drives the second plate to move the first rod in the first direction, the first drive mechanism drives the second plate such that the second plate moves the second sleeve and the first rod.

5. A scanning stage apparatus according to claim 4 wherein the first sleeve is in contact with the first plate through a first flexure bearing and the second sleeve is in contact with the second plate through a second flexure bearing.

6. A scanning stage apparatus according to claim 4 further including:

a force counteracting mechanism, the force counteracting mechanism being arranged to counteract atmospheric pressure forces on the first rod.

7. A scanning stage apparatus according to claim 6 wherein the force counteracting mechanism includes a constant force spring arrangement which is coupled to the first linear motor.

8. A scanning stage apparatus according to claim 6 wherein the table is coupled to a first end of the first rod, and the force counteracting mechanism includes a dummy vacuum chamber, the dummy vacuum chamber being arranged to substantially accommodate a second end of the first rod, the dummy vacuum chamber being arranged to maintain a vacuum level therein.

9. A scanning stage apparatus according to claim 8 further including:

a second wall, the second wall having a first side, the second wall being associated with the dummy vacuum chamber such that the first side of the second wall is an exterior side of the dummy vacuum chamber, the second plate including an air bearing surface, the air bearing surface of the second plate being arranged to be held against the first side of the second wall by a second vacuum force.

10. A scanning stage apparatus according to claim 6 wherein the first drive mechanism includes a second linear motor and a third linear motor, the second linear motor being arranged to drive the first plate, the third linear motor being arranged to drive the second plate.

11. A scanning stage apparatus according to claim 4 further including:

a first diaphragm, the first diaphragm being positioned between the first sleeve and the first plate; and a second diaphragm, the second diaphragm being positioned between the second sleeve and the second plate.

12. A scanning stage apparatus according to claim 2 further including:

a second wall, the second wall having a first side, the second wall being associated with the system vacuum chamber such that the first side of the second wall is an exterior side of the system vacuum chamber, the second plate including an air bearing surface, the air bearing surface of the second plate being arranged to be held against the first side of the second wall by a second vacuum force.

13. A scanning stage apparatus according to claim 12 wherein the air bearing surface includes a preload area which provides force to the air bearing surface when the system vacuum chamber does not contain a vacuum.

14. A scanning stage apparatus according to claim 1 wherein the second drive mechanism includes a second linear motor, the second linear motor being coupled to the second rod.

15. An exposure apparatus comprising the scanning stage apparatus of claim 1.

16. A stage device, the stage device being arranged to scan a reticle in a vacuum environment, the stage device comprising:

a table, the table being arranged to accommodate the reticle thereon;

a rod, the rod having a first end and a second end, wherein the table is coupled to the first end of the rod;

a first plate, the first plate being arranged to support the rod, the first plate including an air bearing surface, the air bearing surface being arranged to at least partially held against an exterior wall of a system chamber by a first vacuum force;

a second plate, the second plate being arranged to support the rod;

a first drive arrangement, the first drive arrangement being arranged to drive the first plate and the second plate in a first direction, wherein driving the first plate and the second plate in the first direction drives the rod in the first direction;

a second drive arrangement, the second drive arrangement being coupled to the first rod to drive the first rod in a second direction; and a third drive arrangement, the third drive arrangement being coupled to the second drive arrangement, wherein the third drive arrangement is arranged to drive the first rod, the first plate, and the second plate in a third direction, and wherein the third drive arrangement, the second drive arrangement, the first drive arrangement, the first plate, and the second plate are arranged to be substantially external to the system chamber.

17. A stage device according to claim 16 wherein the second drive arrangement includes a second rod, a first coil, and a first magnet track, the second rod being coupled to the first coil, the second rod further being coupled to the first rod, the first coil being arranged to cooperate with the magnet track to drive the second rod and the first rod in the second direction.

18. A stage device according to claim 17 further including;
   a first sleeve, the first sleeve being in contact with the first plate;
   a second sleeve, the second sleeve being in contact with the second plate, wherein the first rod is arranged to translate in the second direction through the first sleeve and the second sleeve; and
   a third sleeve, the third sleeve being coupled to the first rod, the second rod being positioned substantially within the third sleeve, wherein the first rod is arranged to translate in the first direction over the second rod.

19. A stage device according to claim 16 wherein the second drive arrangement is coupled to the second end of the first rod and the system chamber contains a vacuum, the stage device further including:
   a force counteractor, the force counteractor being arranged to counteract atmospheric pressure forces on the first rod.

20. A stage device according to claim 19 wherein the force counteractor includes a spring arrangement, the spring arrangement being arranged to apply a force to the first coil to counteract the atmospheric pressure forces on the first rod.

21. A stage device according to claim 16 wherein the second drive arrangement is coupled to the first rod between the first end and the second end, and wherein the system chamber contains a first vacuum, the stage device further including:
   a dummy chamber, the dummy chamber containing a second vacuum, wherein the second end of the first rod is positioned within the dummy chamber.

22. A stage device according to claim 21 wherein the dummy chamber includes an exterior surface, and the second plate includes an air bearing surface that is arranged to at be held against the exterior surface of the dummy chamber by a second vacuum force.

23. A stage device according to claim 16 wherein the first drive arrangement includes a first linear motor and a second linear motor, wherein the first linear motor is arranged to drive the first plate in the first direction and the second linear motor is arranged to drive the second plate in the first direction.

24. A stage device according to claim 23 wherein the first linear motor and the second linear motor are arranged to create differential motion of the first plate and the second plate, and wherein the differential motion causes the first rod to rotate with respect to the first direction.

25. A stage device according to claim 24 wherein the differential motion further causes the table to translate and rotate with respect to the first direction, to translate and rotate with respect to the second direction, and to translate and rotate with respect to the third direction.

26. An exposure apparatus comprising the stage device of claim 16.

27. A scanning stage apparatus comprising:
   a system chamber, the system chamber having a vacuum level, the system chamber including an external surface;
   a table, the table being arranged to be positioned within the system chamber;
   a rod, the rod being coupled to the table;
   a first plate, the first plate being arranged to support the rod substantially outside of the system chamber, the first plate including a first surface that is substantially held against the external surface of the system chamber by a first vacuum force;
   a second plate, the second plate being arranged to support the rod substantially outside of the system chamber;
   a first actuator arrangement, the first actuator arrangement being arranged to drive the first plate and the second plate along a first axis, wherein driving the first plate and the second plate along the first axis drives the rod along the first axis; and
   a second actuator arrangement, the second actuator arrangement being arranged to drive the first plate and the second plate along a second axis, wherein driving the first plate and the second plate along the second axis drives the rod along the second axis.

28. A scanning stage apparatus according to claim 27 further including:
   a third actuator arrangement, the third actuator arrangement being coupled to the rod outside of the system chamber, the third actuator arrangement being arranged to drive the rod along a third axis.

29. A scanning stage apparatus according to claim 28 wherein the rod supports a sleeve and the third actuator arrangement includes a shaft which is at least partially positioned within the sleeve such that the rod is arranged to move along the third axis with the shaft and to move over the shaft along the first axis.

30. A scanning stage apparatus according to claim 28 wherein the second actuator arrangement is coupled to the third actuator arrangement.

31. A scanning stage apparatus according to claim 27 wherein the first plate supports the rod through a first sleeve and the second plate supports the rod through a second sleeve.

32. A scanning stage apparatus according to claim 31 wherein the first plate and the first sleeve are flexually attached to enable the rod to rotate about the first axis and about the second axis.

33. A scanning stage apparatus according to claim 32 wherein the first plate and the first sleeve are attached using a bellows.

34. A scanning stage apparatus according to claim 32 wherein the first plate and the first sleeve are attached using a flexure bearing.

35. A scanning stage apparatus according to claim 27 further including:
   a dummy chamber, the dummy chamber being arranged to maintain a vacuum level therein, wherein the rod is coupled to the table at a first end of the rod and a second end of the rod is positioned within the dummy chamber, whereby positioning the second end of the rod within the dummy chamber counteracts at least some atmospheric pressure forces associated with the rod.

36. A scanning stage apparatus according to claim 35 wherein the dummy chamber includes an external surface and the second plate includes a first surface that is substantially held against the external surface of the dummy chamber by a second vacuum force.

37. A scanning stage apparatus according to claim 27 wherein the second plate includes a first surface that is substantially held against the external surface of the vacuum chamber by a second vacuum force, and the table is coupled to the rod between the first plate and the second plate.

38. A scanning stage apparatus according to claim 27 wherein the rod is a hollow rod, the hollow range being arranged to carry cables, the cables being coupled to the table.

39. A scanning stage apparatus according to claim 38 wherein the rod is formed from a material with a high specific stiffness.

40. A scanning stage apparatus according to claim 39 wherein the rod is formed from silicon carbide, the first plate is formed from alumina ceramic, and the second plate is formed from alumina ceramic.

41. An exposure apparatus comprising the scanning stage apparatus of claim 27.

42. A scanning stage apparatus comprising:
- a system chamber, the system chamber having a first vacuum level, the system chamber including a first external surface;
- a dummy chamber, the dummy chamber having a second vacuum level, the dummy chamber including a second external surface;
- a table, the table being arranged to be positioned within the system chamber;
- a rod, the rod being coupled to the table, wherein a first end of the rod is positioned within the dummy chamber;
- a first plate, the first plate being arranged substantially outside of the system chamber to support the rod, the first plate including a first surface that is substantially held against the first external surface of the system chamber by a first vacuum force;
- a second plate, the second plate being arranged substantially outside of the system chamber to support the rod, the second plate including a second surface that is substantially held against the second external surface of the dummy chamber by a second vacuum force;
- a first actuator arrangement, the first actuator arrangement being arranged to drive the first plate and the second plate along a first axis, wherein driving the first plate and the second plate along the first axis drives the rod along the first axis; and
- a second actuator arrangement, the second actuator arrangement being arranged to drive the first plate and the second plate along a second axis, wherein driving the first plate and the second plate along the second axis drives the rod along the second axis.

43. A scanning stage apparatus according to claim 42 further including:
- a third actuator arrangement, the third actuator arrangement being coupled to the rod outside of the system chamber, the third actuator arrangement being arranged to drive the rod along a third axis.

44. A scanning stage apparatus according to claim 42 wherein the first plate supports the rod through a first sleeve and the second plate supports the rod through a second sleeve.

45. A scanning stage apparatus according to claim 44 wherein a diaphragm is located between the first plate and the first sleeve.

46. A scanning stage apparatus according to claim 42 wherein the first actuator arrangement and the second actuator arrangement are arranged substantially outside of the system chamber.

47. A scanning stage apparatus according to claim 46 wherein the dummy chamber is arranged to reduce leakage in the system chamber.

48. A scanning stage apparatus according to claim 42 wherein the first surface of the first plate includes an area that is arranged to preload the first plate when the first vacuum level is a substantially zero vacuum level.

49. A scanning stage apparatus according to claim 48 wherein the second surface of the second plate includes an area that is arranged to preload the second plate when the second vacuum level is a substantially zero vacuum level.

50. An exposure apparatus comprising the scanning stage apparatus of claim 42.

* * * * *